(12) United States Patent
Hayashi

(10) Patent No.: US 9,219,101 B2
(45) Date of Patent: Dec. 22, 2015

(54) ORGANIC EL DEVICE AND METHOD FOR MANUFACTURING ORGANIC EL DEVICE

(71) Applicant: KANEKA CORPORATION, Osaka-shi, Osaka (JP)

(72) Inventor: Katsuhiko Hayashi, Osaka (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/463,514

(22) Filed: Aug. 19, 2014

(65) Prior Publication Data

US 2014/0353657 A1    Dec. 4, 2014

Related U.S. Application Data

(63) Continuation-in-part of application No. PCT/JP2013/053521, filed on Feb. 14, 2013.

(30) Foreign Application Priority Data

Feb. 20, 2012   (JP) .................. 2012-034089
May 29, 2012   (JP) .................. 2012-122366

(51) Int. Cl.
  *H01L 27/32*   (2006.01)
  *H01L 51/56*   (2006.01)
  (Continued)

(52) U.S. Cl.
  CPC ........ *H01L 27/3204* (2013.01); *H01L 51/5203* (2013.01); *H01L 51/56* (2013.01);
  (Continued)

(58) Field of Classification Search
  CPC . H01L 27/3204; H01L 51/56; H01L 51/5203; H01L 51/5209; H01L 51/5225; H01L 2251/5361; H01L 2251/564
  See application file for complete search history.

(56) References Cited

U.S. PATENT DOCUMENTS

| 6,107,734 A | 8/2000 | Tanaka et al. |
| 2004/0021425 A1 | 2/2004 | Foust et al. |

(Continued)

FOREIGN PATENT DOCUMENTS

| JP | 11329748 A | 11/1999 |
| JP | 2004134359 A | 4/2004 |

(Continued)

OTHER PUBLICATIONS

International Bureau of WIPO, International Preliminary Report on Patentability and Written Opinion in International Patent Application No. PCT/JP2013/053521, Sep. 4, 2014, WIPO, 7 pages.

(Continued)

*Primary Examiner* — Whitney T Moore
(74) *Attorney, Agent, or Firm* — Alleman Hall McCoy Russell & Tuttle LLP

(57) ABSTRACT

The present invention aims at developing an organic EL device having a structure for power supply to a new organic EL element. The device is formed of unit organic EL elements planarly distributed on a substrate having a planar expanse and includes organic EL element columns and organic EL element rows. The organic EL element columns and the organic EL element rows each have a conductive path in which electric current passes in its longitudinal direction. The organic EL element columns and the organic EL element rows have different longitudinal directions so that their conductive paths cross with each other at a part where the organic EL element columns and the organic EL element rows cross with each other.

10 Claims, 36 Drawing Sheets

(51) Int. Cl.
*H01L 51/52* (2006.01)
*H05B 33/08* (2006.01)

(52) U.S. Cl.
CPC ........ *H05B33/0896* (2013.01); *H01L 27/3241* (2013.01); *H01L 51/5209* (2013.01); *H01L 51/5225* (2013.01); *H01L 2251/5361* (2013.01); *H01L 2251/564* (2013.01)

(56) References Cited

U.S. PATENT DOCUMENTS

| | | |
|---|---|---|
| 2005/0248935 A1 | 11/2005 | Strip et al. |
| 2012/0161616 A1* | 6/2012 | Yamagishi et al. ........... 313/504 |

FOREIGN PATENT DOCUMENTS

| | | |
|---|---|---|
| JP | 2005108516 A | 4/2005 |
| JP | 2007536708 A | 12/2007 |
| JP | 2009123363 A | 6/2009 |
| JP | 2009289742 A | 12/2009 |
| WO | 2009072386 A1 | 6/2009 |

OTHER PUBLICATIONS

Japanese Patent Office, International Search Report of PCT/JP2013/053521, May 21, 2013, 4 pages.

* cited by examiner

A-A

B-B

C-C

C-C

D-D

D-D

ORGANIC EL DEVICE AND METHOD FOR MANUFACTURING ORGANIC EL DEVICE

CROSS-REFERENCE TO RELATED APPLICATIONS

This application is a continuation-in-part of PCT International Application PCT/JP2013/053521, which was filed Feb. 14, 2013, and which claims priority to Japanese Patent Application Ser. Nos. 2012-034089, filed Feb. 20, 2012 and 2012-122366, filed May 29, 2012, the entire disclosures of each of which are herein incorporated by reference for all purposes.

TECHNICAL FIELD

The present invention relates to an organic EL (Electro Luminescence) device mainly used for lighting. The present invention also relates to a method for manufacturing an organic EL device.

BACKGROUND ART

Recently, organic EL devices are attracting attention as lighting equipment taking the place of an incandescent light or a fluorescent light and have been studied well.

An organic EL device is formed by stacking organic EL elements on a substrate such as a glass substrate, a transparent resin film, or a metal sheet and forming a power supply structure for supplying power to the organic EL elements (Patent document 1, for example).

An organic EL element is formed by stacking a light emission layer, which is composed of organic compounds, between two electrodes, either one or both of which have translucency, made to face with each other. An organic EL device emits light by an energy generated in recombination of electrically excited electrons and holes.

In sum, an organic EL device is a self-emitting device that can emit light of various wavelengths by appropriately selecting a material of the light emission layer.

Further, an organic EL device advantageously has few restrictions regarding a place of installation, since it is extremely thin and light compared to an incandescent light, a fluorescent light, and an LED light, and emits light planarly. Further, an organic EL device also advantageously has low power consumption and generates little heat since it has a higher luminous efficiency than an incandescent light or a fluorescent light.

PATENT DOCUMENT

Patent Document 1: JP 2005-108516 A

DISCLOSURE OF INVENTION

Technical Problem

Herein, a structure for power supply to organic EL elements is important in order to incorporate an organic EL device in lighting equipment or the like.

Hence, the present invention therefore aims at providing an organic EL device including a structure for power supply to a new organic EL element.

Solution to Problem

An aspect of the present invention to achieve the above-mentioned object is an organic EL device including a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, the organic EL element belts each having in its longitudinal direction a conductive path through which electric current passes, and the organic EL element belts extending in different longitudinal directions and crossing with each other, forming a crossing part, so that the conductive paths cross with each other within the organic EL element belts and within the crossing part.

The configuration in this aspect includes a plurality of organic EL element belts each formed of a plurality of unit organic EL elements electrically connected in series on the substrate so as to extend in a strip-like shape. The organic EL element belts each have in its longitudinal (extending) direction a conductive path through which electric current passes. In short, in each of the organic EL element belts, a plurality of the unit organic EL elements are electrically connected in series. Electric current passes through the conductive path by application of voltage between both ends in the longitudinal direction of the organic EL element belt, thereby allowing the whole organic EL element belt, to which the voltage has been applied, to emit light. In sum, the organic EL device in this aspect makes individual unit organic EL elements emit light in the extending direction of the organic EL element belts, so as to secure a light emission area.

Further, the configuration in this aspect includes the organic EL element belts extending in different longitudinal directions and crossing with each other, forming a crossing part, so that the conductive paths cross with each other within the crossing part. In sum, in the organic EL device in this aspect, the organic EL element belts extend in at least two directions.

In a case where, for example, the organic EL element belts extend in lengthwise and crosswise directions and consist of lengthwise-extending organic EL element belts (hereinafter referred also to as an organic EL element column) and crosswise-extending organic EL element belts (hereinafter referred also to as an organic EL element row), which cross with each other at their intermediate parts (crossing part), electric current passes through the conductive path in the organic EL element column or the organic EL element row by application of a voltage to either of the organic EL element column or the organic EL element row, so that the crossing part emits light. In sum, whichever belt (the organic EL element column or the organic EL element row) electric current flows to, the unit organic EL element located at the crossing part emits light, serving as a lighting. Therefore, provision of a power supply terminal for the organic EL element column to one side of the organic EL device and a power supply terminal for the organic EL element row to another side thereof can change a position to which the power source is connected for supplying power to the unit organic EL elements. That brings high plasticity to the environment.

Further, the organic EL device in this aspect achieves lighting with less flickering even when the device is directly connected to a commercial power source.

Herein, the commercial power source is an alternating current and changes in current-carrying direction at a predetermined cycle.

The organic light-emitting layer constituting the organic EL element has a pn junction so as to allow electric current to flow in only one direction. Thus, when the commercial power source is directly connected to the organic EL element, electric current flows to emit light for a half cycle, but the electric current is interrupted for the remaining half cycle, resulting in a lighting-off-state. Therefore, when the commercial power source is directly connected to the conventional organic EL device, the device may repeat flashing at 50 hertz or 60 hertz in Japan, resulting in causing flickering.

In contrast, in the organic EL device in this aspect, the organic EL element belts extend, for example, in lengthwise and crosswise directions, so that any one of the organic EL element belts always emits light only if the organic EL element column and the organic EL element row are connected to the commercial power source with their polarities changed. Further, since the organic EL element belts cross with each other and the conductive paths cross with each other within the crossing part, the crossing part continuously emits light without flickering.

More specifically, during an AC half cycle, for example, the unit organic EL elements are connected to the commercial power source so that the pn junction of the elements making up one of the organic EL element belts is oriented in a forward direction relative to an electric current polarity of the commercial power source, while the pn junction of the elements making up the other of the organic EL element belts is oriented in a backward direction relative to an electric current polarity.

As a result, one of the organic EL element belts emits light by the pn junction oriented in a forward direction for a predetermined period of time. The other of the organic EL element belts emits light by the pn junction oriented in a forward direction during the next half cycle. Nevertheless, the crossing part continuously emits light, so as to prevent flickering.

For example, among two electrodes consisting of an anode and a cathode included in the organic EL element column and two electrodes consisting of an anode and a cathode included in the organic EL element row, the column-type anode and the row-type cathode am connected to one electrode, while the column-type cathode and the row-type anode are connected to the other electrode. The two electrodes are connected to an AC power source such as a commercial power source, so that the organic EL element column and the organic EL element row alternately emit light by a cycle of alternating electric current. In any cycle of positive or negative polarities of alternating electric current, the crossing part of the organic EL element column and the organic EL element row continuously emit light. Thus, users experience little flickering because the device does not become dark in switching of positive and negative polarities in the cycle of alternating electric current.

It is preferable that the organic EL element belts include at least one organic EL element column extending in one direction and at least one organic EL element row extending in a direction crossing with the organic EL element column, that the unit organic EL element in the crossing part is formed of a stack of a substrate-side electrode layer, a functional layer, and a rear face-side electrode layer, and that the substrate-side electrode layer and the rear face-side electrode layer allow electricity to be applied to the same functional layer in any case that power is supplied through the conductive path of the organic EL element column or that power is supplied through the conductive path of the organic EL element row.

Preferably, the organic EL element belts cross with each other in a grid pattern and the organic El device has a non-light emitting region surrounded by the organic EL element belts.

It is desirable that the organic EL element belts are each formed of a stack of a substrate-side electrode layer, a functional layer, and a rear face-side electrode layer, that the substrate-side electrode layer and the rear face-side electrode layer allows electricity to be applied to the functional layer, and that at least one of the functional layer and the rear face-side electrode layer is not in the stack in at least a part of the non-light emitting region.

It is desirable that the organic EL element belts are each formed of a stack of a substrate-side electrode layer, a functional layer, and a rear face-side electrode layer, and that the substrate-side electrode layer has at least one groove dividing the layer, wherein the groove is formed over the non-light emitting region and a region where the organic EL element belt is located.

It is desirable that the organic EL element belts include at least one organic EL element column extending in one direction and at least one organic EL element row extending in a direction crossing with the organic EL element column, the unit organic EL elements making up the organic EL element column each being formed of a stack of the two electrode layers and a first functional layer (hereinafter referred to as a column-type functional layer), which belongs to the above-described functional layer between the two electrode layers, the unit organic EL elements making up the organic EL element row each being formed of a stack of the two electrode layers and a second functional layer (hereinafter referred to as a row-type functional layer), which belongs to the above-described functional layer between the two electrode layers, and the crossing part including both the column-type functional layer and the row-type functional layer stacked between the two electrode layers.

It is desirable that the organic EL element belts include at least one organic EL element column extending in one direction and at least one organic EL element row extending in a direction crossing with the organic EL element column, and that the at least two electrode layers include a first electrode layer, a second electrode layer, and a third electrode layer, the unit organic EL elements making up the organic EL element column each being formed of a stack of the first electrode layer, the second electrode layer, and a column-type functional layer between the first and the second electrode layers, the unit organic EL elements making up the organic EL element row each being formed of a stack of the first electrode layer, the third electrode layer, and a row-type functional layer between the first and the third electrode layers, the second electrode layer, and the third electrode layer, and further including the column-type functional layer and the row-type functional layer either between the first electrode layer and the second electrode layer or between the first electrode layer and the third electrode layer.

Desirably, the unit organic EL elements each have a pn junction, the organic EL element belts each being formed of a serial connection of the pn junctions of the unit organic EL elements belonging to the belt, wherein the organic EL element belts each have a p-side power supply part and an n-side power supply part, and the p-side power supply part and the n-side power supply part of the organic EL element belts are connected to an AC power source in parallel.

It is desirable that the organic EL element belts include (1) a plurality of organic EL element columns each extending in one direction and having a first end at one side and a second end at the other side and (2) a plurality of organic EL element rows each extending in a direction crossing with the organic EL element column and having a third end at one side and a fourth end at the other side, the unit organic EL elements each having a pn junction with a p-side and an n-side, the first ends being in electrical contact with the p-side of the unit organic EL elements and the second ends being in electrical contact with the n-side, the third ends being in electrical contact with the p-side of the unit organic EL elements and the fourth ends being in electrical contact with the n-side, and the first ends of the organic EL element columns in electrical contact with the p-side and the fourth ends of the organic EL element rows in electrical contact with the n-side being in electrical contact with each other.

It is desirable that the device has a square outer shape with sides and corners, the device further including two conducting members each for bringing two sides including one corner into electrical contact with each other, and the two conducting members being connected to an AC power source.

It is desirable that the substrate has a periphery and that the device has a plurality of extraction regions formed along the periphery of the substrate, the extraction regions each including one electrode layer and being in electrical contact with the organic EL element belts, and the device further including a power supply electrode attached over a plurality of the extraction regions.

It is desirable that the unit organic EL elements each are formed of a stack of a substrate-side electrode layer, the organic light-emitting layer, and a rear face-side electrode layer in order in a stacking direction from a side of the substrate, that the device further includes (1) a dielectric layer having dielectricity stacked on an upper side of the rear face-side electrode layer in the stacking direction and (2) a dielectric electrode layer stacked on an upper side of the dielectric layer in the stacking direction and on a projected plane in a member thickness direction of the crossing part of the organic EL element belts, and that the dielectric electrode layer is electrically connected to the substrate-side electrode layer.

According to the configuration in this aspect, when electric current flows from the substrate-side electrode layer through the organic light-emitting layer to the rear face-side electrode layer, a part of the electric current is transmitted to the dielectric electrode layer, and whereby a potential difference is generated between the dielectric electrode layer and the rear face-side electrode layer, so that electric charge is accumulated within the dielectric layer. Then, when the supply of the electric current is stopped, the electric charge having been accumulated on the surface of the dielectric layer is released and transmitted to the substrate-side electrode layer. Thereby, as well as in the power supply, the electric current flows from the substrate-side electrode layer through the organic light-emitting layer to the rear face-side electrode layer. In other words, the dielectric layer serves as a capacitor, so that light is emitted for a predetermined period of time even when the electric current supply is stopped. Therefore, the light is gradually turned off.

Further, when the power is supplied by an AC power source, this aspect prevents flickering generated by switching of a cycle.

It is desirable that the organic EL element belts include at least one organic EL element column extending in one direction and at least one organic EL element row extending in a direction crossing with the organic EL element column, the dielectric electrode layer including one electrically connected to the substrate-side electrode layer of the organic EL element column and one electrically connected to the substrate-side electrode layer of the organic EL element row.

Further, another aspect of the present invention is a method for manufacturing of the above-mentioned organic EL device and includes the steps of a first electrode layer forming process of forming a first electrode layer on the substrate, a first electrode layer separation process of forming a first electrode layer separation groove by laser-scribing the first electrode layer, a preceding functional layer forming process of forming a first functional layer including a hole injection layer, a hole transport layer, a light-emitting layer, an electron transport layer, an electron injection layer, and so on sequentially at a certain position, a succeeding functional layer forming process of forming a second functional layer including a hole injection layer, a hole transport layer, a light-emitting layer, an electron transport layer, an electron injection layer, and so on sequentially over a part overlapping the first functional layer and a part without overlapping the first functional layer, an electrode connection groove forming process of forming an electrode connection groove by laser scribing, a second electrode layer forming process of forming an electrode layer so as to overlap one of the first functional layer and the second functional layer, a third electrode layer forming process of forming an electrode layer so as to overlap the other of the first functional layer and the second functional layer, and a unit organic EL element separation groove forming process of forming a unit organic EL element separation groove by laser scribing.

It is recommended that the method further include the steps of an insulation layer forming process of forming an insulation layer, an insulation groove forming process of forming an opening reaching the first electrode layer by laser-scribing the insulation layer, and a dielectric electrode layer forming process of forming a dielectric electrode layer.

Advantageous Effect of Invention

According to the configuration of this invention, power is supplied to individual unit organic EL elements, thereby making the individual elements emit light.

DESCRIPTION OF EMBODIMENTS

Now, embodiments of the present invention will be described in detail below, making reference to the attached figures.

In the description below, a direction from right to left is referred to as a crosswise direction and a direction from up to down is referred to as a lengthwise direction in a plan view in FIG. 2, unless otherwise specifically noted. Herein, in FIGS. 12 to 16, the same layers are illustrated on the same plane, respectively, for easy understanding. Spaces are drawn between the layers in a member thickness direction for convenience of explanation, but the layers actually have close contact with each other without space.

Figure 1:
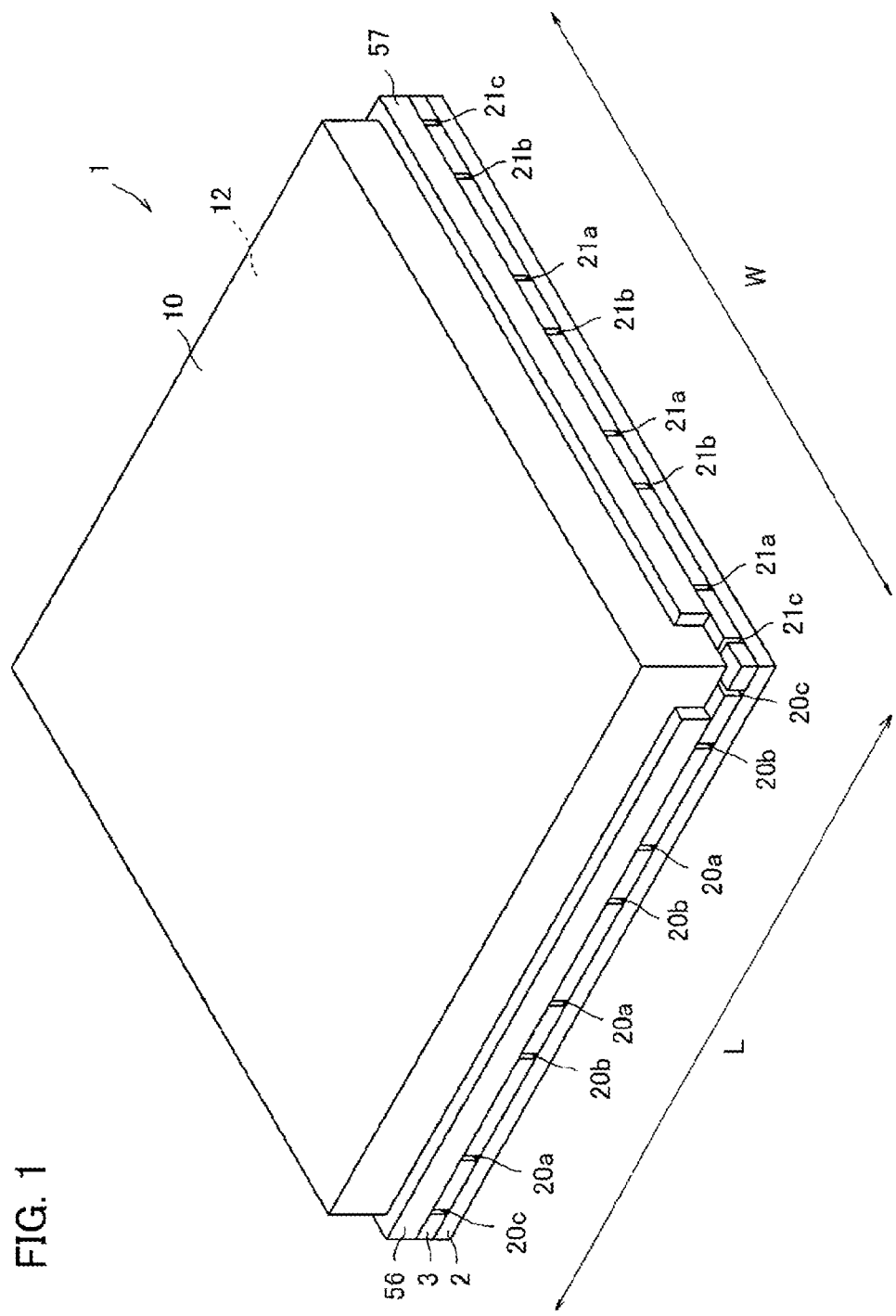
FIG. 1 is a perspective view of an organic EL device in a first embodiment of the present invention.
Figure 3:
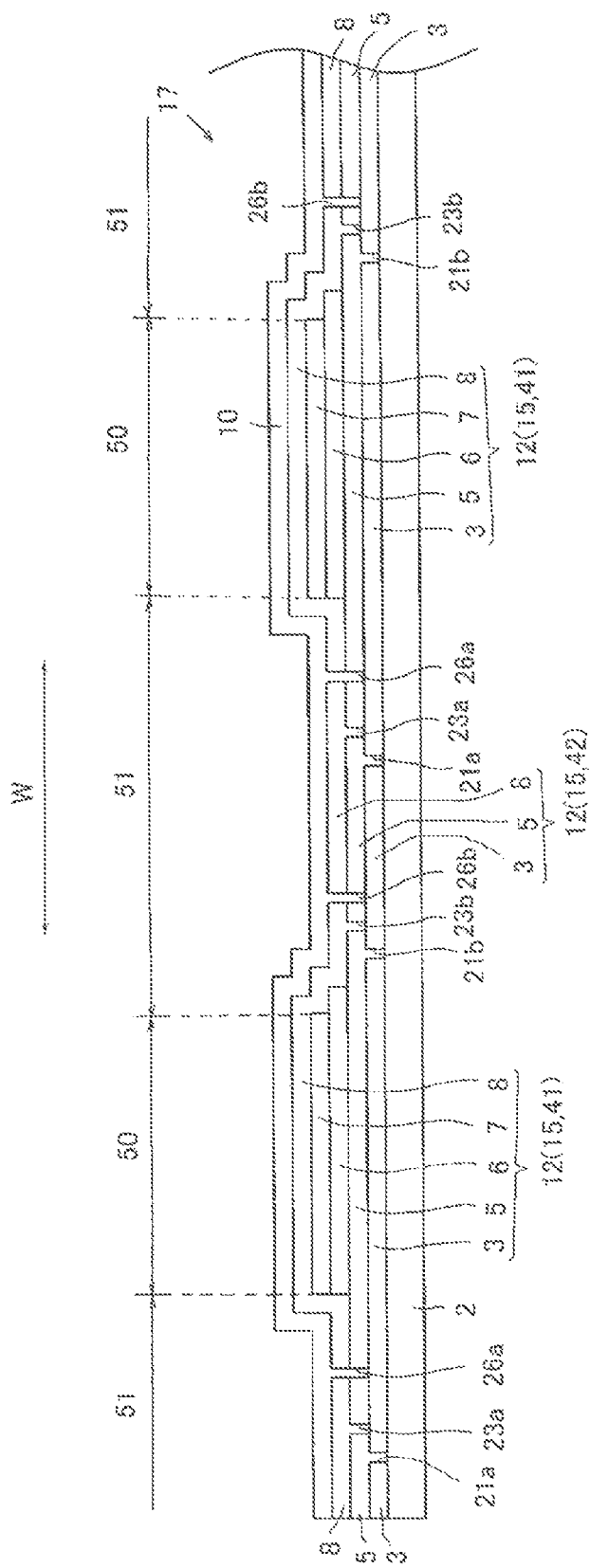
FIG. 3 is a cross section taken along a line A-A of the organic EL device in FIG. 2.
Figure 4:
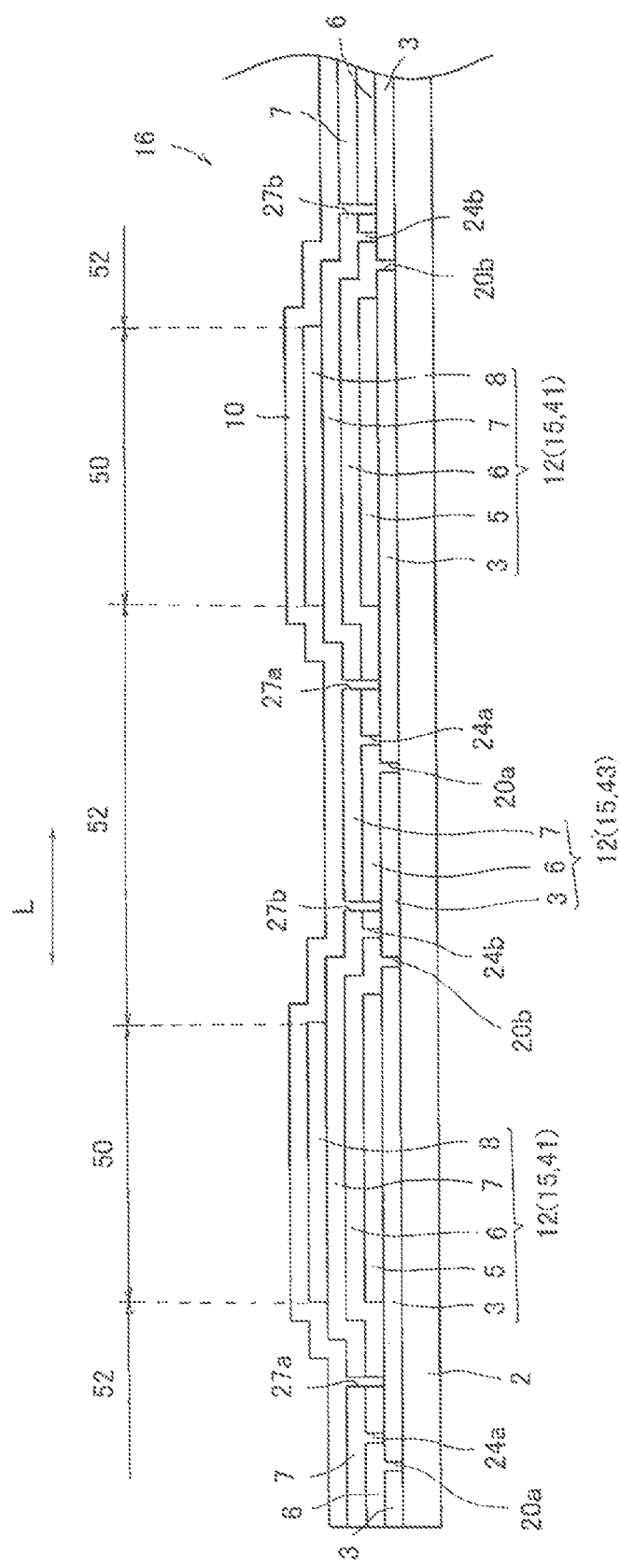
FIG. 4 is a cross section taken along a line B-B of the organic EL device in FIG. 2.

An organic EL device 1 is, as shown in FIGS. 1, 3, and 4, formed of a stack of an organic EL element 12 and an insulation layer 10 on a substrate (base material) 2 having a translucency.

Figure 2:
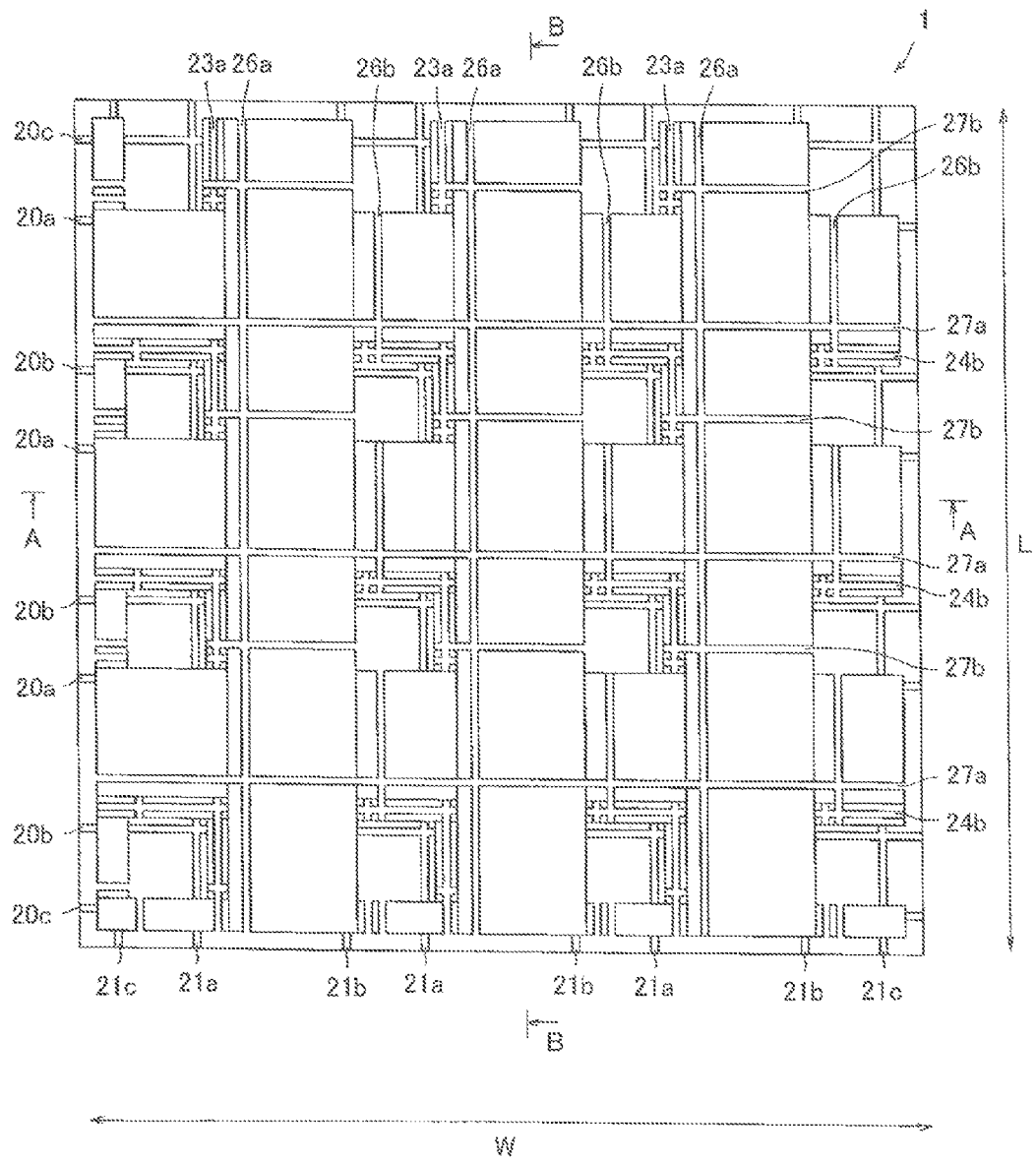
FIG. 2 is a plan view of the organic EL device in FIG. 1 in which an insulation layer is omitted.

The organic EL element 12 stacked on the substrate 2 is divided into parts in a grid pattern by a plurality of grooves as shown in FIGS. 2, 3, and 4, so as to form a plurality of unit organic EL elements 15.

The "organic EL element" referred to herein denotes an integrated member formed of two electrode layers with a functional layer sandwiched therebetween.

Figure 5:
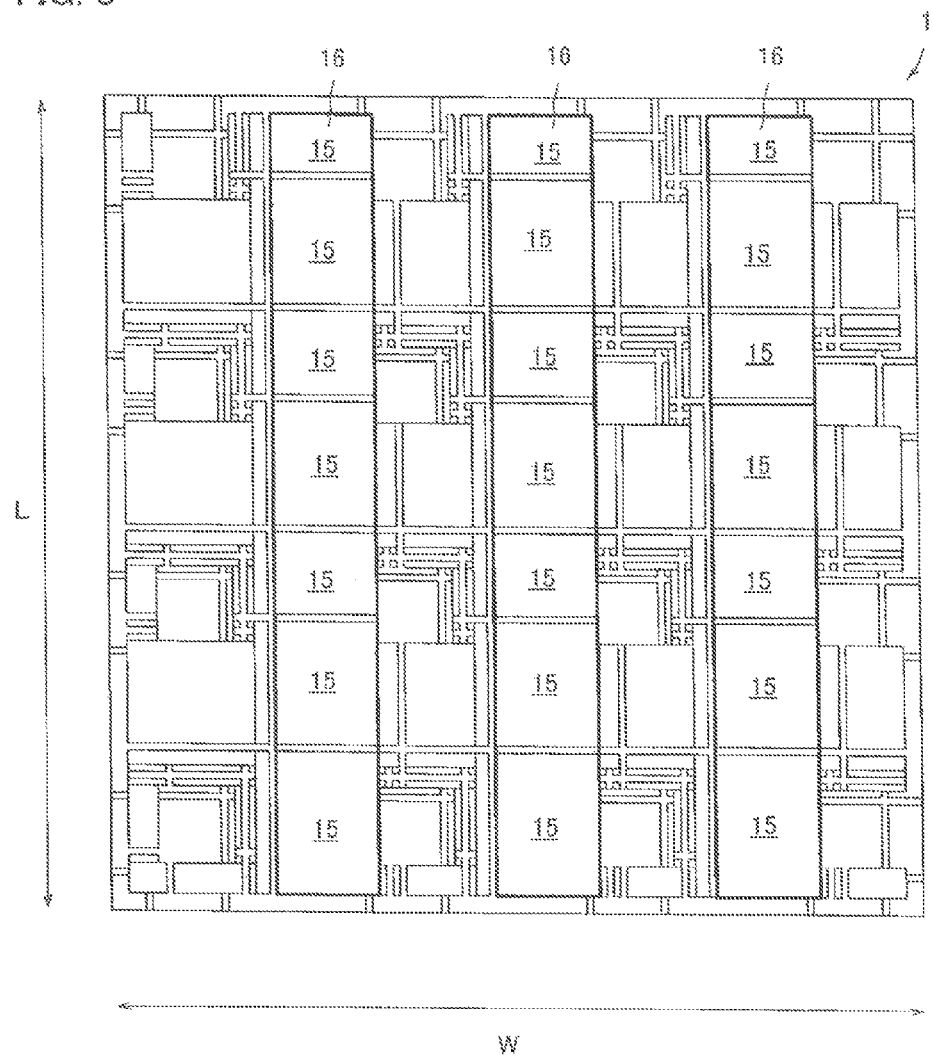
FIG. 5 is an explanatory diagram of the organic EL device in FIG. 2 with organic EL element columns defined by thick lines.
Figure 6:
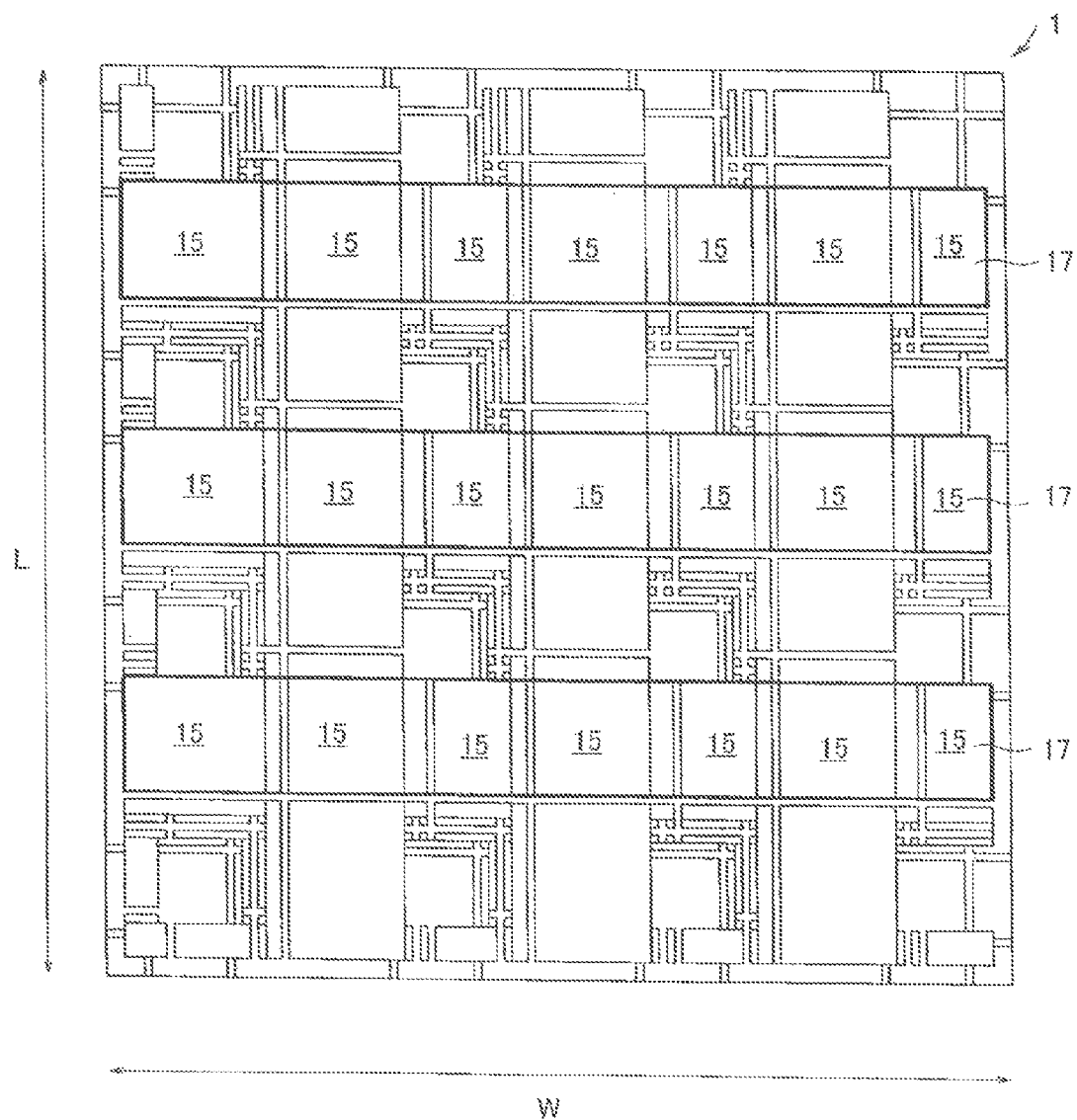
FIG. 6 is an explanatory diagram of the organic EL device in FIG. 2 with organic EL element rows defined by thick lines.

The organic EL device 1 includes organic EL element columns (column-type organic EL element belts) 16 formed of a plurality of the unit organic EL elements 15 connected in a lengthwise direction L as shown in FIG. 5 and organic EL element rows (row-type organic EL element belts) 17 formed of a plurality of the unit organic EL elements 15 connected in a crosswise direction W as shown in FIG. 6. Specifically, three or more organic EL element columns 16 (three in this embodiment) and three or more organic EL element rows 17 (three in this embodiment) are arranged in a grid pattern.

The organic EL element column 16 and the organic EL element row 17 each are a laminated body extending in a strip-like shape. The organic EL element row 17 has the same width as that of the organic EL element column 16.

Referring to FIG. 3, the organic EL element row 17 includes at least a first electrode layer 3 (primary electrode layer) near the substrate 2, a first functional layer 5 (organic light-emitting layer), and a third electrode layer 8 (secondary electrode layer) near a rear face. In the organic EL element row 17, the first functional layer 5 operating as a row-type functional layer is disposed between the first electrode layer 3 serving as a substrate-side electrode layer and the third electrode layer 8 serving as a rear face-side electrode layer.

Referring to FIG. 4, the organic EL element column 16 includes at least the first electrode layer 3 (primary electrode layer) near the substrate 2, a second functional layer 6 (organic light-emitting layer), and a second electrode layer 7 (secondary electrode layer) near the rear face. In the organic EL element column 16, the second functional layer 6 operating as a column-type functional layer is disposed between the first electrode layer 3 serving as the substrate-side electrode layer and the second electrode layer 7 serving as the rear face-side electrode layer.

Figure 7:
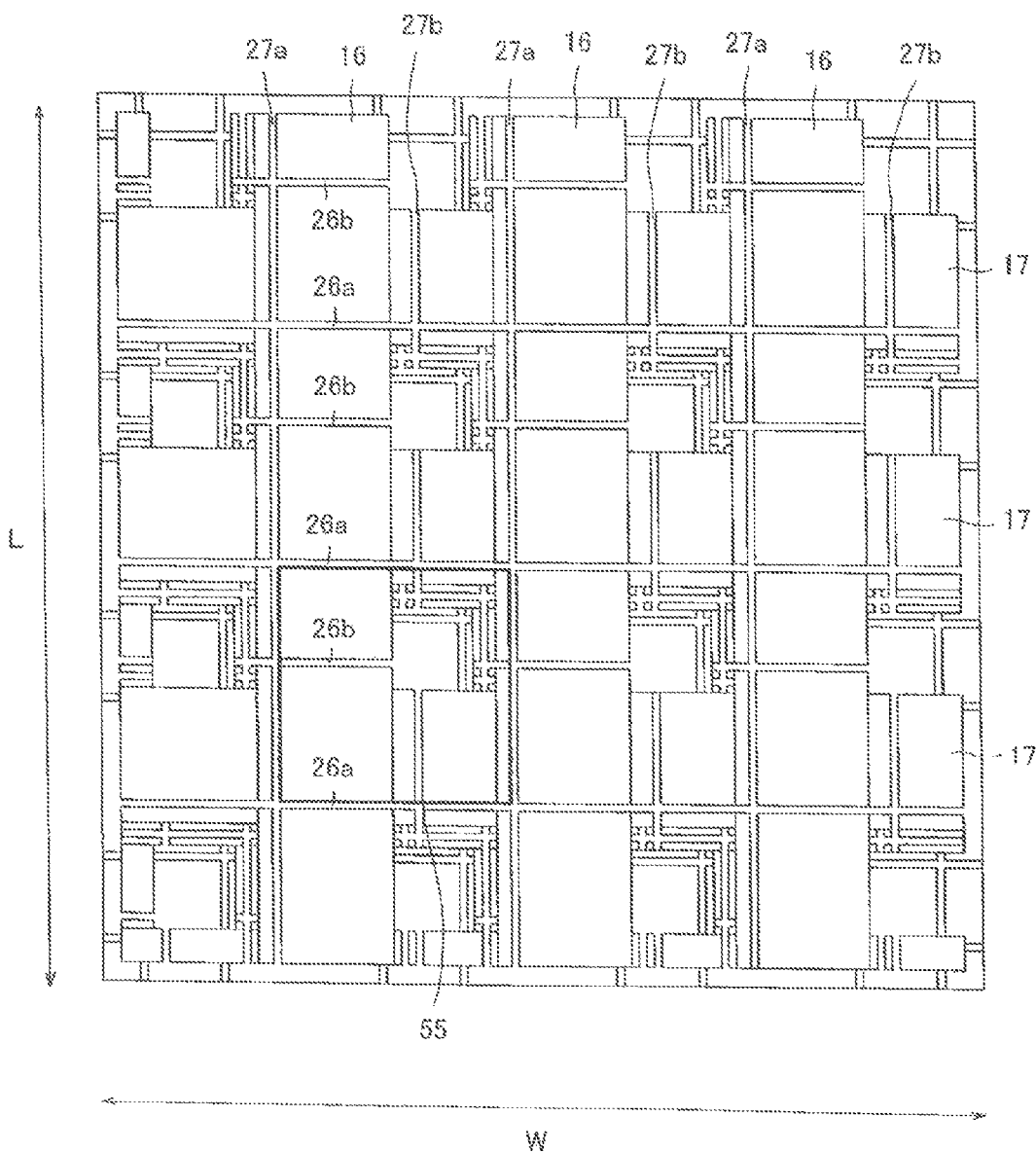
FIG. 7 is an explanatory diagram of the organic EL device in FIG. 2 with a unit organic EL element region defined by a thick line.

Further, the organic EL device 1 is formed by arranging unit organic EL element regions 55 as defined by a thick line in FIG. 7, which are divided by unit organic EL element separation grooves 26a and 27a, on an entire surface of the substrate 2 in between in a grid pattern.

Figure 8:
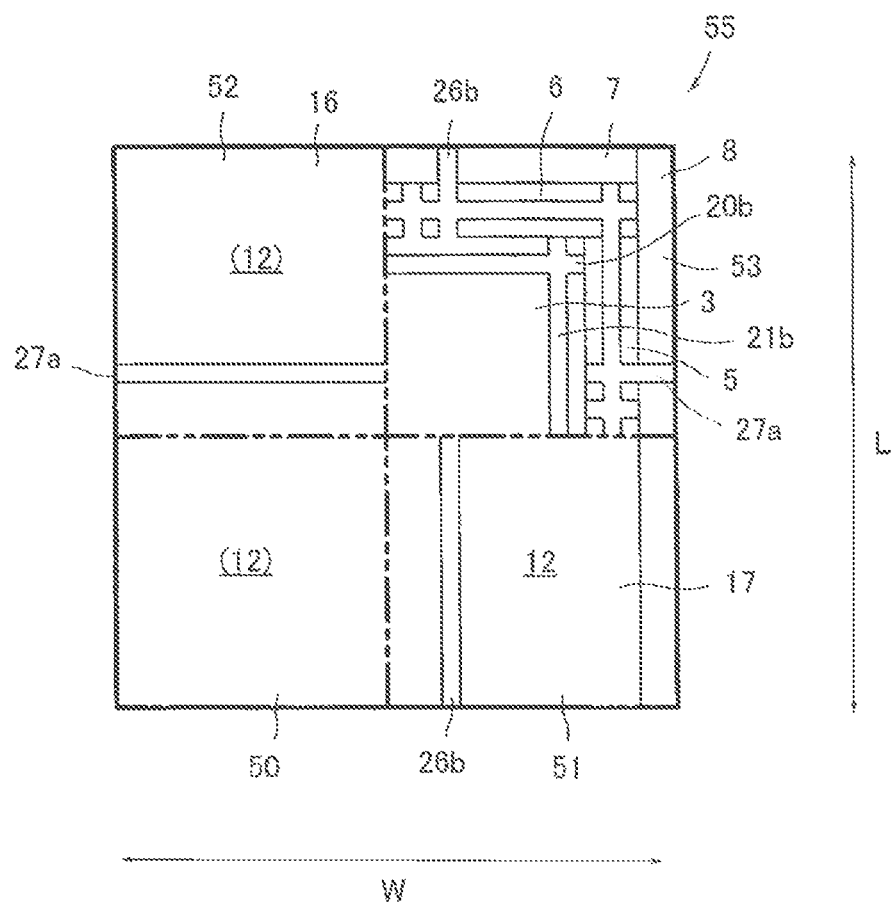
FIG. 8 is an explanatory diagram of the organic EL device in FIG. 7 with the unit organic EL element region clipped and enlarged.

Each of the unit organic EL element regions 55, as shown in FIG. 8, includes a crossing organic EL element region 50 that belongs to both the organic EL element column 16 and the organic EL element row 17 and where the organic EL element column 16 and the organic EL element row 17 cross with each other. Further, the unit organic EL element region 55 includes a column-type organic EL element region 52 on which the organic EL element 12 that belongs only to the organic EL element column 16 is stacked and a row-type organic EL element region 51 on which the organic EL element 12 that belongs only to the organic EL element row 17 is stacked. Still further, the unit organic EL element region 55 includes a non-organic EL element region 53 that belongs to neither the organic EL element column 16 nor the organic EL element row 17. In this embodiment, the non-organic EL element region 53 is a non-light emitting region that never emits light.

In this way, each of the unit organic EL element regions 55 has the crossing organic EL element region 50, the column-type organic EL element region 52, the row-type organic EL element region 51, and the non-organic EL element region 53.

The column-type organic EL element region 52 is a quadrangular region that emits light upon application of voltage in a forward direction of a pn junction to the organic EL element column 16.

The row-type organic EL element region 51 is a quadrangular region that emits light upon application of voltage in a forward direction of a pn junction to the organic EL element row 17.

The crossing organic EL element region 50 is a quadrangular region that continuously emits light when driven by being connected to an AC power source. The crossing organic EL element region 50 is a region surrounded by the column-type organic EL element region 52 and the row-type organic EL element region 51.

The non-organic EL element region 53, which is a non-light emitting region, is a region surrounded by the row-type organic EL element region 51 and the column-type organic EL element region 52 and does not emit light even when driven by being connected to an AC: power source.

In the unit organic EL element region 55, as shown in FIG. 8, the crossing organic EL element region 50 and the non-organic EL element region 53 are located at a diagonal position to each other, whereas the column-type organic EL element region 52 and the row-type organic EL element region 51 are located at a remaining diagonal position to each other.

Figure 9:
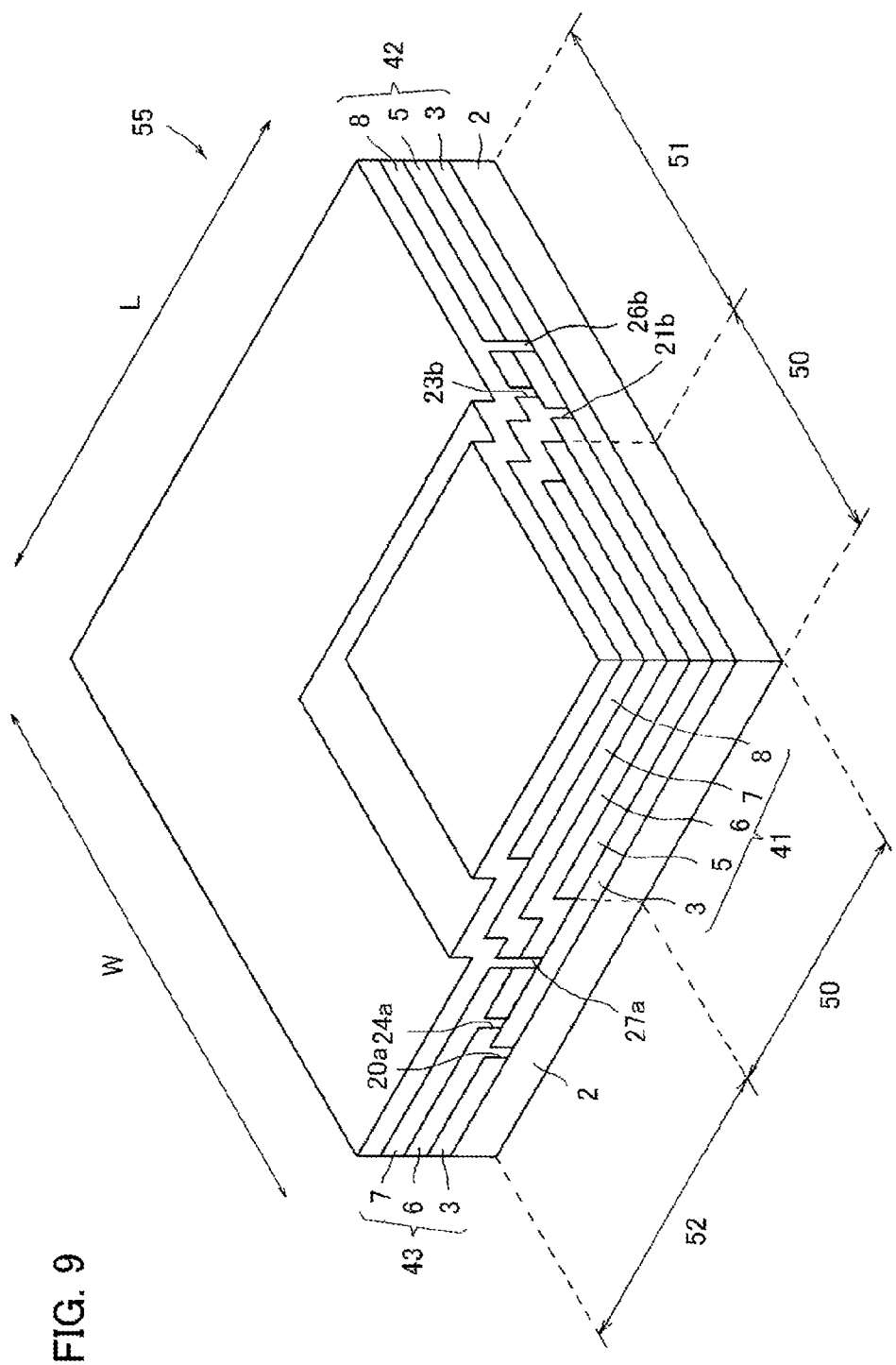
FIG. 9 is a schematic diagram of the unit organic EL element region in FIG. 8.

Referring to FIG. 9, the unit organic EL element that belongs to the crossing organic EL element region 50 (hereinafter referred also to as a crossing unit organic EL element 41) is formed of a stack of the first electrode layer 3 serving as the substrate-side electrode layer, the first functional layer 5 operating as the row-type functional layer, the second functional layer 6 operating as the column-type functional layer, and the second electrode layer 7 and the third electrode layer 8 serving as the rear face-side electrode layer from a side of the substrate 2. In this embodiment, the first functional layer 5 operating as the row-type functional layer and the second functional layer 6 operating as the column-type functional layer are sandwiched between the first electrode layer 3 and the second electrode layer 7. Herein, the first functional layer 5 and the second functional layer 6 may be sandwiched between the first electrode layer 3 and the third electrode layer 8. Further, in the crossing organic EL element region 50, the second electrode layer 7 and the third electrode layer 8 may be one electrode layer.

The unit organic EL element that belongs to the row-type organic EL element region 51 (hereinafter referred to as a row-type unit organic EL element 42) is formed of a stack of the first electrode layer 3, the first functional layer 5, and the third electrode layer 8 from the side of the substrate 2.

The unit organic EL element that belongs to the column-type organic EL element region 52 (hereinafter referred also to as the column-type unit organic EL element 43) is formed of a stack of the first electrode layer 3, the second functional layer 6 operating as the column-type functional layer, and the second electrode layer 7 from the side of the substrate 2.

As shown in FIGS. 4 and 9, the organic EL device 1 is formed, in the lengthwise direction L, of the column-type organic EL element regions 52 and the crossing organic EL element regions 50 alternately arranged in order of the column-type organic EL element region 52, the crossing organic EL element region 50, the column-type organic EL element region 52, the crossing organic EL element region 50, and so on.

As shown in FIGS. 4 and 9, in the organic EL, in the lengthwise direction device 1, the column-type unit organic EL element 43 and the crossing unit organic EL element 41 are electrically connected to each other in series via the first electrode layer 3, the second electrode layer 7, and below-mentioned electrode connection grooves 24 (column-type electrode connection grooves 24a and 24b).

Meanwhile, the organic EL device 1 is formed, in the crosswise direction W, of the row-type organic EL element regions 51 and the crossing organic EL element regions 50 alternately arranged in order of the row-type organic EL element region 51, the crossing organic EL element region 50, the row-type organic EL element region 51, the crossing organic EL element region 50, and so on.

Further, as shown in FIGS. 3 and 4, in the organic EL device 1, in the crosswise direction W, the crossing unit organic EL element 41 and the row-type unit organic EL element 42 are electrically connected to each other in series via the first electrode layer 3, the third electrode layer 8, and below-mentioned electrode connection grooves 23 (row-type electrode connection grooves 23a and 23b) as shown in FIG. 9.

The organic EL device 1 is, as shown in FIG. 2, separated and divided into a plurality of compartments by a plurality of grooves that have different depths.

Specifically, the organic EL device 1 has first electrode layer separation grooves 20 and 21 that are formed by partially removing the first electrode layer 3, electrode connection grooves 23 and 24 that are formed by partially removing the first functional layer 5 and/or the second functional layer 6, and unit organic EL element separation grooves 26a, 26b, 27a, and 27b that are formed by partially removing the first functional layer 5 and/or the second functional layer 6, and the second electrode layer 7 and/or the third electrode layer 8. Those grooves divide the device 1 into a plurality of compartments.

Figure 10:
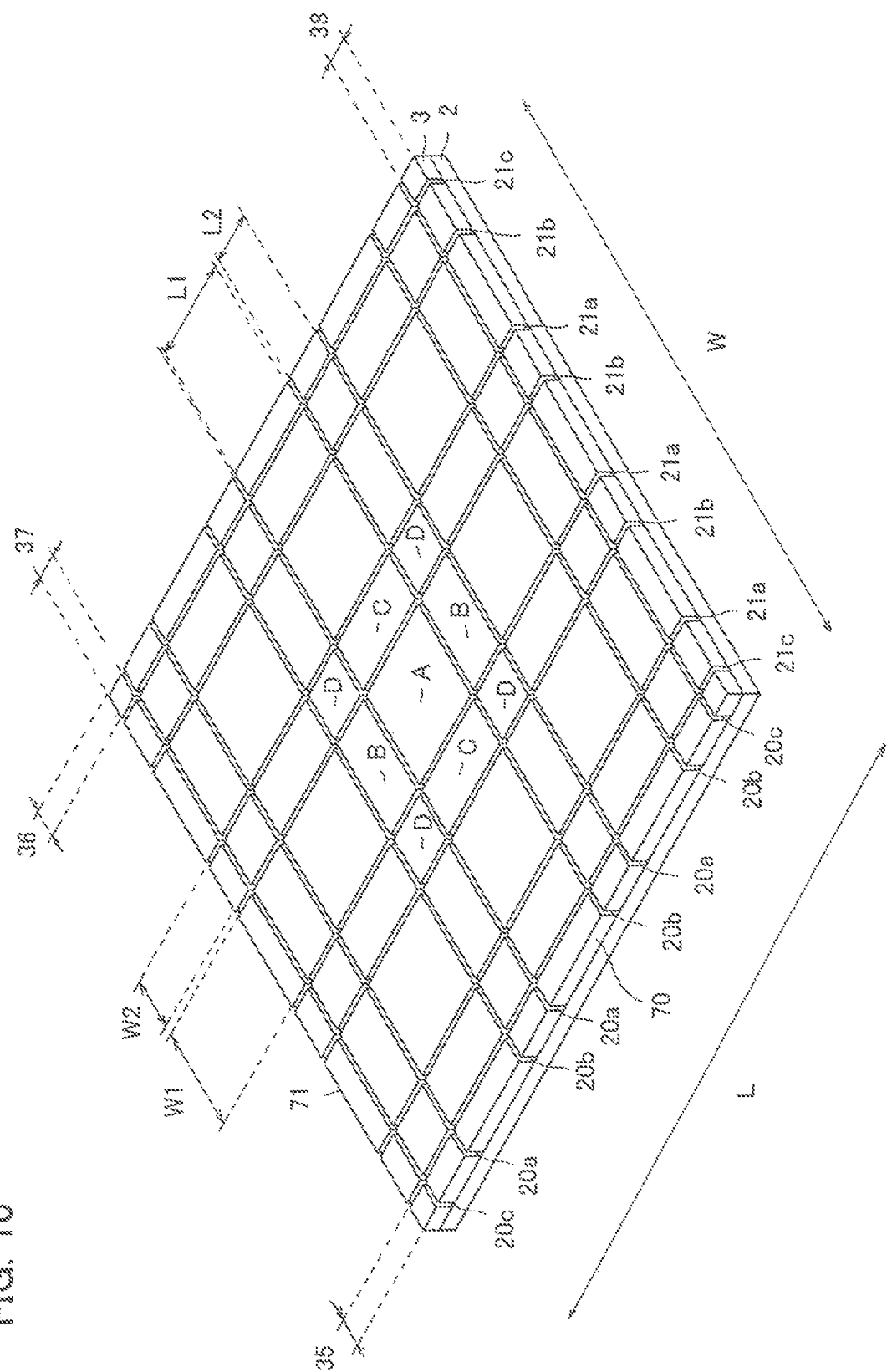
FIG. 10 is an explanatory diagram showing a manufacturing process of the organic EL device in FIG. 1, being a schematic diagram at the end of a first electrode layer separation process.

The first electrode layer separation grooves 20 and 21, as shown in FIGS. 2 and 10, divide the first electrode layer 3 stacked on the substrate 2 into a plurality of regions lengthwise and crosswise. The first electrode layer separation grooves 20 (column-type first electrode layer separation grooves 20a to 20c) are formed in parallel with a transverse side that is a side in the crosswise direction and extend in the whole crosswise direction W. Meanwhile, the first electrode layer separation grooves 21 (row-type first electrode layer separation grooves 21a to 21c) are formed in parallel with a lengthwise side that is a side in the lengthwise direction L and extend in the whole lengthwise direction L.

The first functional layer 5 or the second functional layer 6 fills a part of the first electrode layer separation grooves 20 and 21 as shown in FIGS. 3 and 4, so as to have contact with the substrate 2 at the bottoms of the first electrode layer separation grooves 20 and 21.

Figure 13:
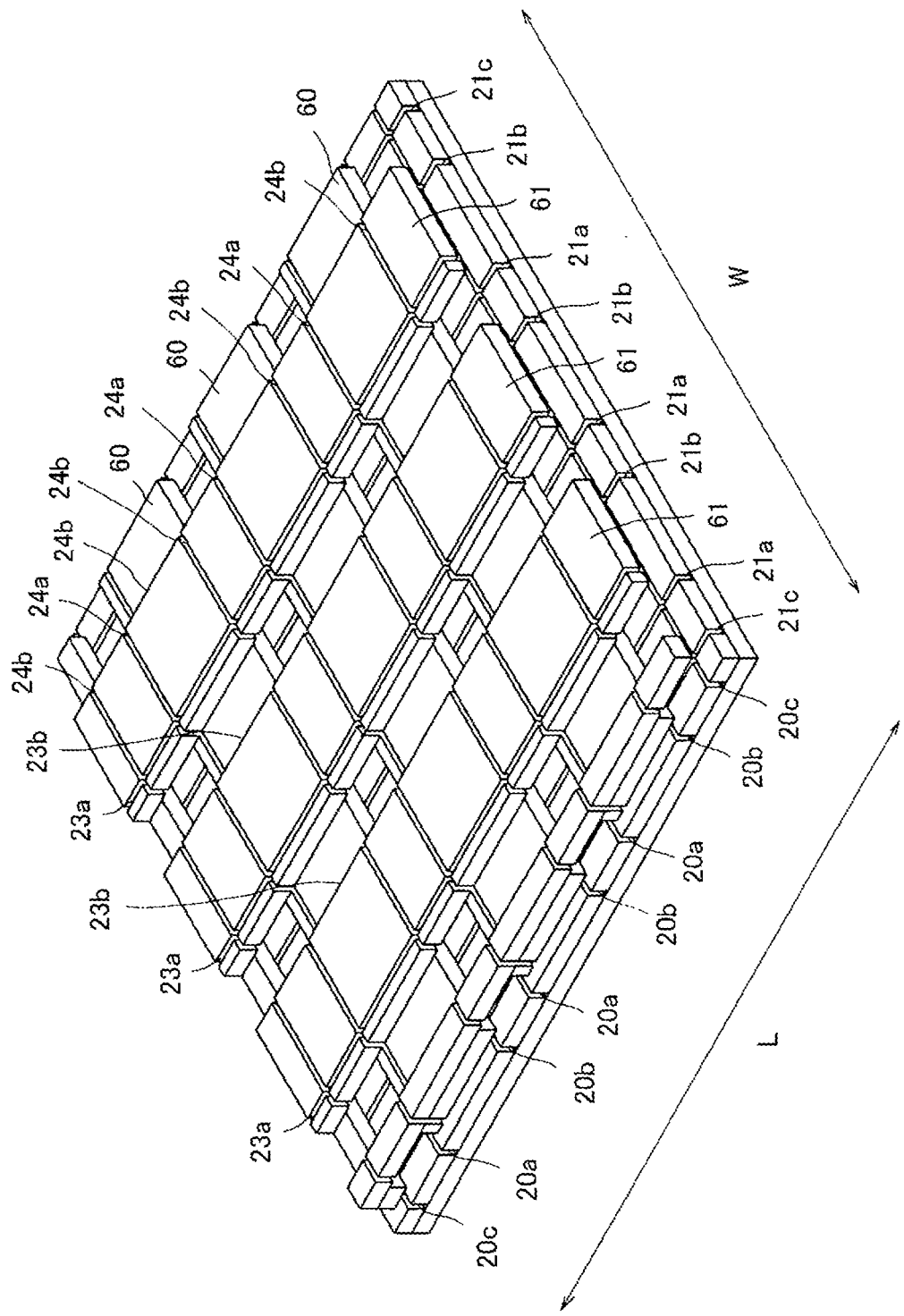
FIG. 13 is an explanatory diagram showing the manufacturing process of the organic EL device in FIG. 1, being a schematic diagram at the end of an electrode connection groove forming process, the same layer being described on the same plane to facilitate understanding.

The electrode connection grooves 23 and 24, as shown in FIGS. 2 and 13, extend in the whole lengthwise/crosswise directions and divide the first functional layer 5 and/or the second functional layer 6 into a plurality of regions.

More specifically, the electrode connection grooves 23 divide the first functional layer 5 into a plurality of regions in an area where the third electrode layer 8 is stacked on the first functional layer 5. Meanwhile, the electrode connection grooves 24 divide the second functional layer 6 into a plurality of regions in an area where the second electrode layer 7 is stacked on the second functional layer 6.

The column-type electrode connection grooves 24a and 24b are formed in parallel with the first electrode layer separation grooves 20, while the row-type electrode connection grooves 23a and 23b are formed in parallel with the first electrode layer separation grooves 21.

The second electrode layer 7 or the third electrode layer 8 fills a part of the electrode connection grooves 23 or 24 as shown in FIGS. 3 and 4, so as to have contact with the first electrode layer 3 at the bottoms of the electrode connection grooves 23 or 24.

Each of the electrode connection grooves 23 and 24 has a groove width of 30 μm or more and 80 μm or less, preferably of 40 μm or more and 70 μm or less, and most preferably of 45 μm or more and 60 μm or less.

Figure 16:
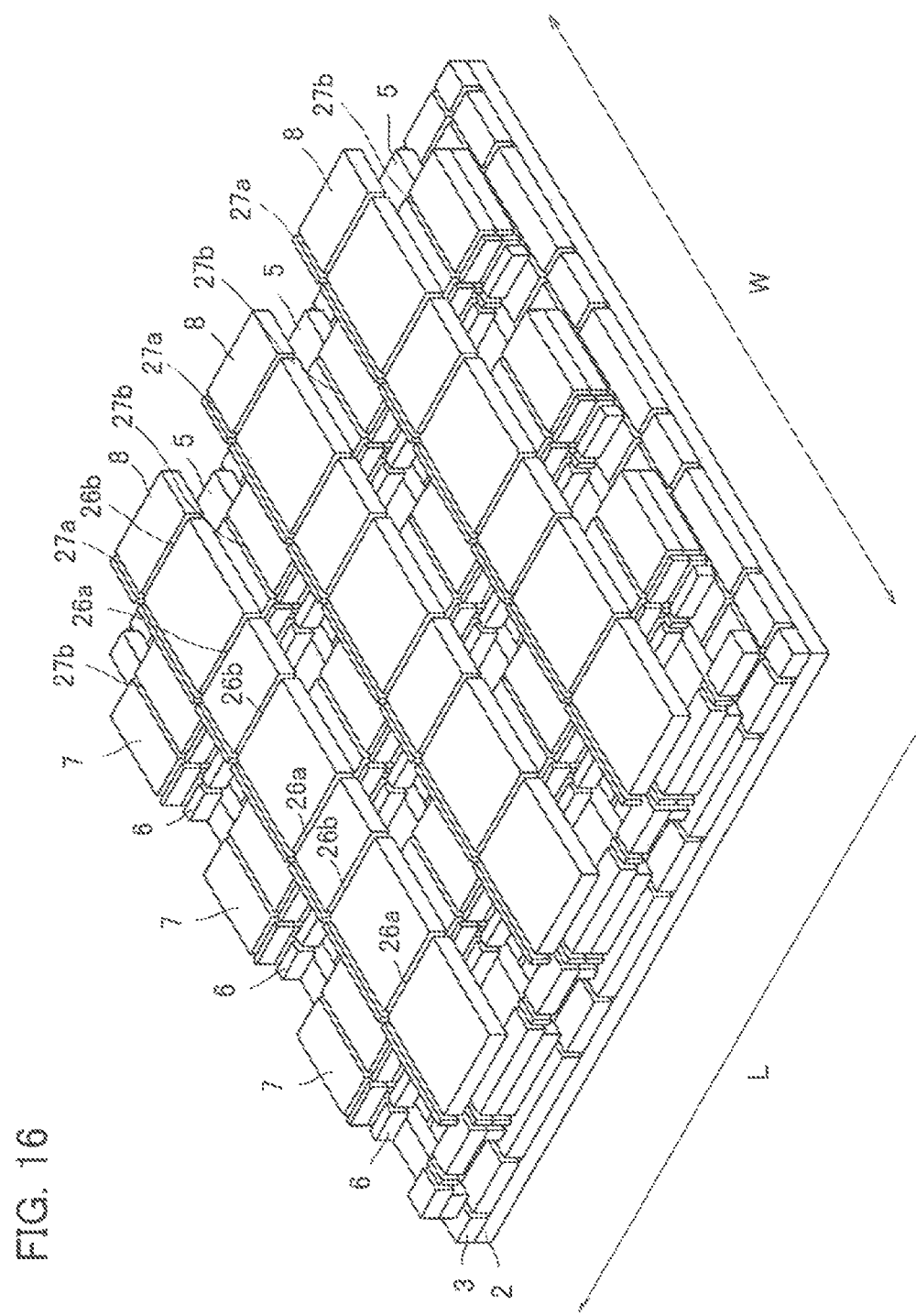
FIG. 16 is an explanatory diagram showing the manufacturing process of the organic EL device in FIG. 1, being a schematic diagram at the end of an organic EL element separation groove forming process, the same layer being described on the same plane to facilitate understanding.

The unit organic EL element separation grooves 26a, 26b, 27a, and 27b, as shown in FIGS. 2 and 16, extend in the whole lengthwise/crosswise directions and divide the functional layers 5 and 6 and the electrode layers 7 and 8 stacked on the respective layers 5 and 6 together into a plurality of regions.

In sum, the grooves 26a, 26b, 27a, and 27b divide the first functional layer 5 and/or the second functional layer 6, and the second electrode layer 7 and/or the third electrode layer 8 into a plurality of regions.

More specifically, the unit organic EL element separation grooves 26a and 26b, as shown in FIG. 3, divide the first functional layer 5 and the third electrode layer 8 into a plurality of regions in the area where the third electrode layer 8 is stacked on the first functional layer 5. Meanwhile, the unit organic EL element separation grooves 27a and 27b, as shown in FIG. 4, divide the second functional layer 6 and the second electrode layer 7 into a plurality of regions in the area where the second electrode layer 7 is stacked on the second functional layer 6.

The unit organic EL element separation grooves 27a and 27b are formed in parallel with the column-type first electrode layer separation grooves 20a to 20c, while the unit organic EL element separation grooves 26a and 26b are formed in parallel with the row-type first electrode layer separation grooves 21a to 21c.

The insulation layer 10 penetrates a part of the unit organic EL element separation grooves 26a, 26b, 27a, and 27b, so as to have contact with the first electrode layer 3 at the bottoms of the unit organic EL element separation grooves 26a, 26b, 27a, and 27b. In other words, the insulation layer 10 electrically separates the regions 50 to 53 except the first electrode layer 3.

Figure 18:
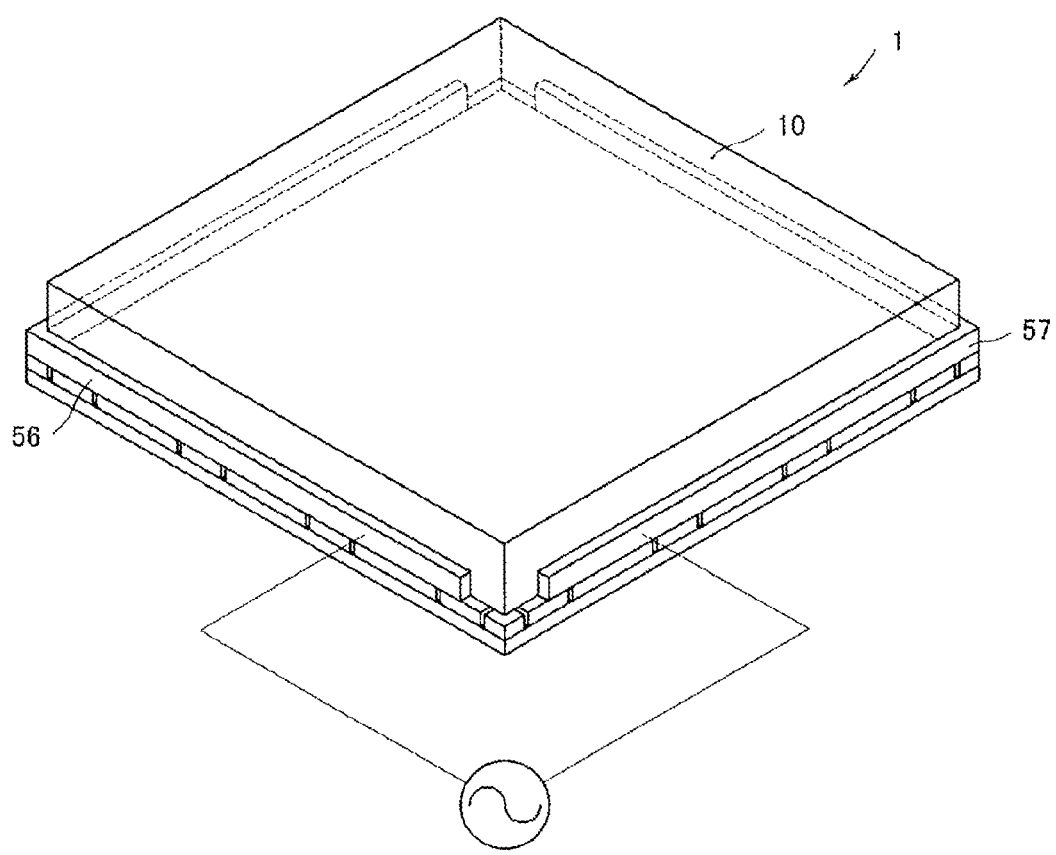
FIG. 18 is a conceptual diagram showing the organic EL device in FIG. 1 connected to an AC power source.

Power supply electrodes 56 and 57 are electrodes each having an "L" shaped face as shown in FIGS. 1 and 18 and members that are electrically connected to an external power source.

The power supply electrodes 56 and 57 each are a conducting member for bringing two sides of the device including a corner into electrical contact with each other and this embodiment is provided with two of these.

Next, a method for manufacturing the organic EL device 1 in the present embodiment will be described below.

The organic EL device 1 is manufactured by forming films by using a vacuum deposition apparatus and a CVD (chemical vapor deposition) device not shown and patterning by using a patterning apparatus (laser scribing device in this embodiment) not shown and a mask process in film-formation.

Firstly, the first electrode layer 3 is formed on a part of or the entire area of the substrate 2 by a sputtering method or a CVD method (first electrode layer forming process). As described above, the first electrode layer 3 serves as the substrate-side electrode layer.

At this time, the first electrode layer 3 to be formed has an average thickness of 50 nm to 800 nm preferably and of 100 nm to 400 nm more preferably.

Thereafter, the first electrode layer separation grooves 20 and 21 are formed on the resulting substrate, on which the first electrode layer 3 has been formed, by using the laser scribing device as shown in FIG. 10 (first electrode layer separation process).

The first electrode layer separation grooves 20 and 21 each are shaped continuously linear and formed over the non-light emitting regions (non-organic EL element regions 53) and the region where the organic EL element columns and rows 16 and 17 are located.

When the first electrode layer separation grooves 20 and 21 are formed on the square substrate 2, as shown in FIG. 10, the column-type first electrode layer separation grooves 20a, the column-type first electrode layer separation grooves 20b, and the column-type first electrode layer separation grooves 20c are plurally formed in parallel with the transverse side 71 of the substrate 2 and in the whole crosswise direction W. Further, the row-type first electrode layer separation grooves 21a, the row-type first electrode layer separation grooves 21b, and the row-type first electrode layer separation grooves 21c are plurally formed in parallel with the lengthwise side 70 of the substrate 2 and in the whole lengthwise direction L.

In the lengthwise direction L, on the resulting substrate 2 (exactly the substrate including laminated members, the same being applied to the following description), the column-type first electrode layer separation grooves 20a and the column-type first electrode layer separation grooves 20b are alternately formed and the column-type first electrode layer separation grooves 20c are formed at the outer sides of those grooves 20a and 20b.

The column-type first electrode layer separation grooves 20a are formed at even intervals in the lengthwise direction L. The column-type first electrode layer separation grooves 20b are also formed at even intervals in the lengthwise direction L. A distance L1 between the column-type first electrode layer separation groove 20a (at a rear side in FIG. 10) and the column-type first electrode layer separation groove 20b adjacent thereto is longer than a distance L2 between the latter column-type first electrode layer separation groove 20b and the column-type first electrode layer separation groove 20a adjacent thereto (at a front side in FIG. 10).

In the crosswise direction W, the row-type first electrode layer separation grooves 21a and the row-type first electrode layer separation grooves 21b are alternately formed and the row-type first electrode layer separation grooves 21c are formed at the outer sides of those grooves 21a and 21b. The row-type first electrode layer separation grooves 21a are formed at even intervals in the crosswise direction. The row-type first electrode layer separation grooves 21b are also formed at even intervals in the crosswise direction. A distance W1 between the row-type first electrode layer separation groove 21a (at a left side in FIG. 10) and the row-type first electrode layer separation groove 21b adjacent thereto is longer than a distance W2 between the latter row-type first electrode layer separation groove 21b and the row-type first electrode layer separation groove 21a adjacent thereto (at a right side in FIG. 10).

Further, in this embodiment, the first electrode layer separation grooves 20 and the first electrode layer separation grooves 21 intersect perpendicularly with each other.

Specifically, the first electrode layer separation grooves 20 and the first electrode layer separation grooves 21 divide the first electrode layer 3 into a plurality of regions in a grid pattern. In other words, a plurality of island-shaped regions where the first electrode layer 3 is stacked are formed on the substrate 2.

Further, as described above, the distance L1 between the column-type first electrode layer separation groove 20a and the column-type first electrode layer separation groove 20b and the distance L2 between the column-type first electrode layer separation groove 20b and the column-type first electrode layer separation groove 20a are different, while the distance W1 between the row-type first electrode layer separation groove 21a and the row-type first electrode layer separation groove 21b and the distance W2 between the row-type first electrode layer separation grooves 21b and the row-type first electrode layer separation groove 21a are different. Thus, at least three regions having different areas (four areas in this embodiment) are formed in the region where the first electrode layer 3 is stacked.

Specifically, in the substrate 2 are formed regions A, regions B that are located adjacent to the regions A in the lengthwise direction, regions C that are located adjacent to the regions A in the crosswise direction, and regions D that are located adjacent to the regions B and the regions C. More specifically, each region A has one side length W1 and one side length L1, each region B has one side length W1 and one side length L2, each region C has one side length W2 and one side length L1, and each region D has one side length W2 and one side length L2.

Further, the first electrode layer 3 exists on the substrate 2, except the first electrode layer separation grooves 20 and 21 as shown in FIG. 10. Thus, the laser scribing process is enabled in this way and a mask process to mask a surface not to be film-formed when the first electrode layer 3 is formed can be omitted.

Further, extraction regions 37 and 38 are formed at the outer side of the column-type first electrode layer separation grooves 20c along a periphery of the substrate 2.

Still further, extraction regions 35 and 36 are formed at the outer side of the row-type first electrode layer separation grooves 21c along the periphery of the substrate 2.

The power supply electrode 56 can be connected to the extraction regions 35 and 37. The power supply electrode 57 can be connected to the extraction regions 36 and 38.

Figure 11:
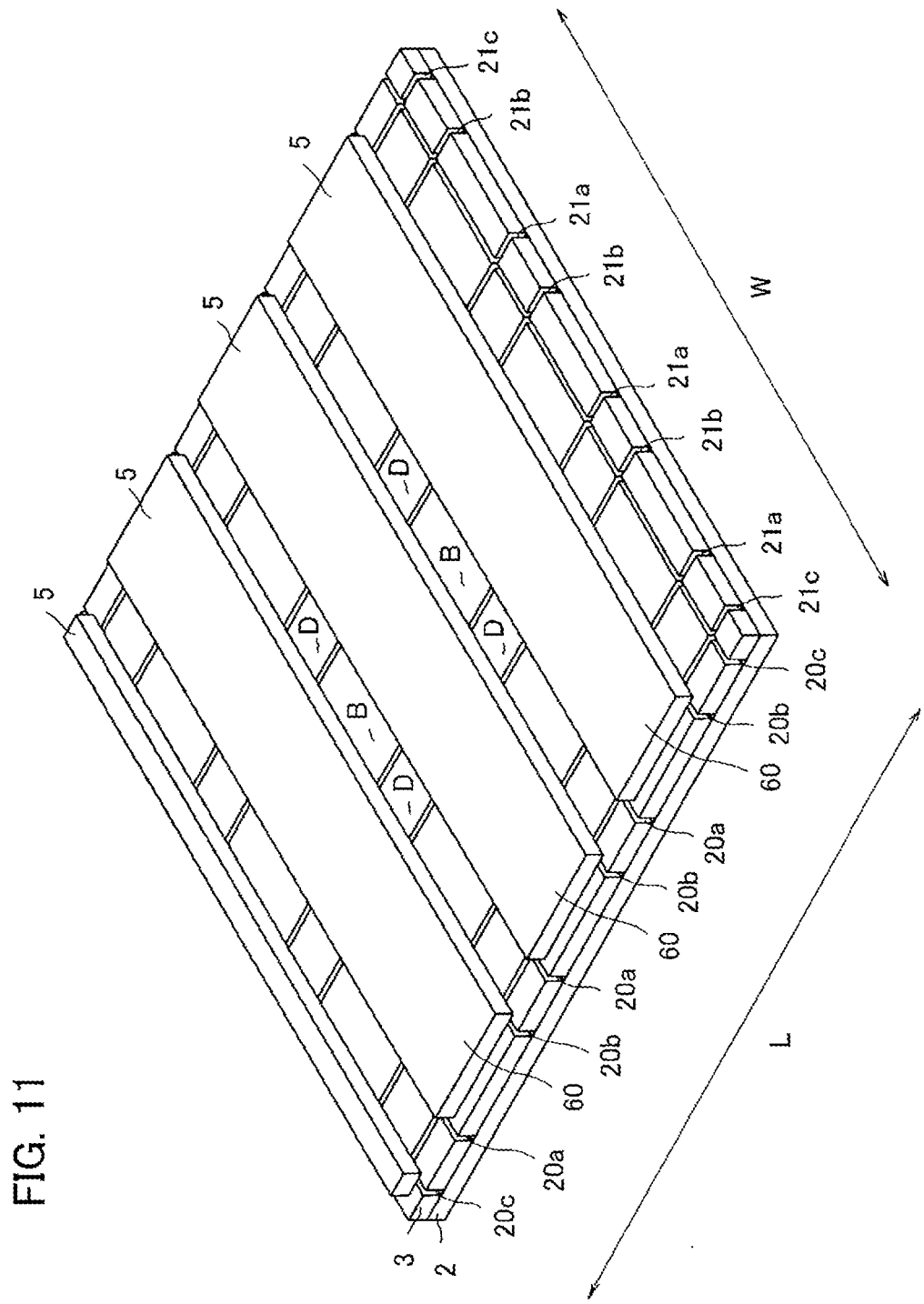
FIG. 11 is an explanatory diagram showing the manufacturing process of the organic EL device in FIG. 1, being a schematic diagram at the end of a first functional layer forming process.

Next, a plurality of rectangular masks adapted to cover in the whole crosswise direction are arranged on the resulting substrate 2 and the first functional layer 5 including a hole injection layer, a hole transport layer, a light-emitting layer, an electron transport layer, an electron injection layer, and so on, is formed sequentially by the vacuum deposition apparatus (first functional layer forming process) as shown in FIG. 11. In this embodiment, the functional layers are formed twice. Hence, this process corresponds to a preceding forming process. As described above, the first functional layer 5 operates as the row-type functional layer.

Herein, the masks are formed so as to cover the entirety of the column-type first electrode layer separation grooves 20a and not to cover the entirety of the column-type first electrode layer separation grooves 20b.

At this time, as shown in FIG. 11, strip-like first functional layer belts 60 each composed of the first functional layer 5 are formed on the first electrode layer 3 and extend in the whole crosswise direction W. The first functional layer belt 60 is formed over the column-type first electrode layer separation groove 20c. Specifically, the first functional layer 5 is stacked on and filled in the column-type first electrode layer separation grooves 20b and the first functional layer 5 is stacked also on the entire surface of the substrate 2, thereby forming a plurality of first functional layer belts 60 composed of the first functional layer 5 and aligned in the lengthwise direction L. The first functional layer belts 60 are formed at predetermined intervals in the lengthwise direction. The first functional layer belts 60 cover most of the regions A and C, while the first electrode layer 3 is exposed in most of the regions B and D.

The first functional layer 5 has an average thickness of 50 nm to 250 nm preferably and 120 nm to 200 nm more preferably.

Herein, the first functional layer 5 is not stacked on the extraction regions 35 to 38 (see FIG. 10).

Figure 12:
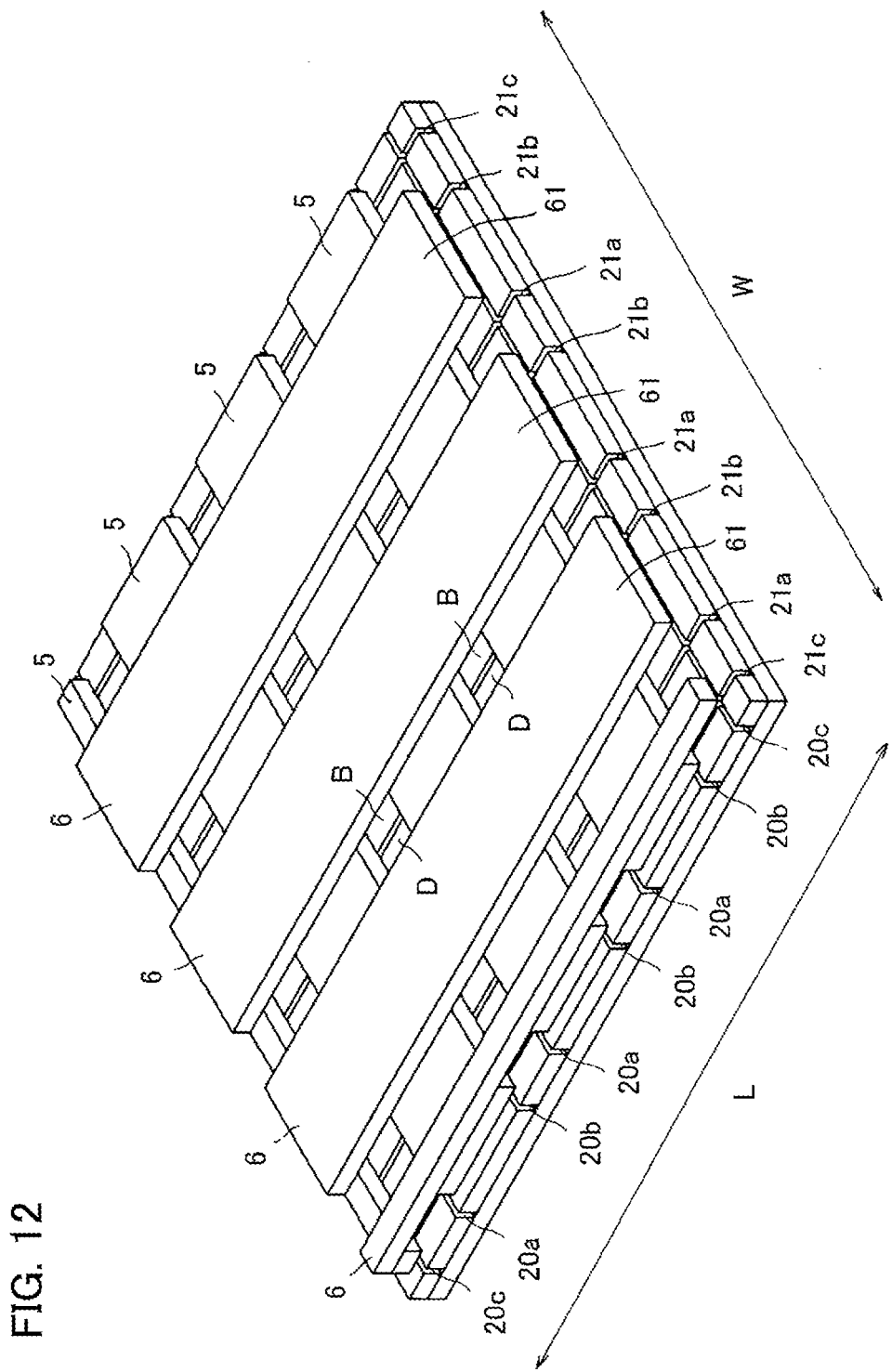
FIG. 12 is an explanatory diagram showing the manufacturing process of the organic EL device in FIG. 1, being a schematic diagram at the end of a second functional layer forming process, the same layer being described on the same plane to facilitate understanding.

Thereafter, a plurality of rectangular masks adapted to cover in the whole lengthwise direction are arranged on the resulting substrate 2 and the second functional layer 6 including a hole injection layer, a hole transport layer, a light-emitting layer, an electron transport layer, an electron injection layer, and so on, is formed sequentially by the vacuum deposition apparatus (second functional layer forming process) as shown in FIG. 12. In this embodiment, the functional layers are formed twice. Hence, this process corresponds to a succeeding forming process. As described above, the second functional layer 6 operates as the column-type functional layer.

Herein, the masks are formed so as to cover the entirety of the row-type first electrode layer separation grooves 21a and not to cover the row-type first electrode layer separation grooves 21b.

At this time, strip-like second functional layer belts 61 each composed of the second functional layer 6 are formed on the first electrode layer 3 and the first functional layer 5 and extend in the whole lengthwise direction L. Specifically, the second functional layer belts 61 cross with the first functional layer belts 60 so as to form a grid pattern. In this embodiment, the second functional layer belts 61 intersect perpendicularly with the first functional layer belts 60 above the substrate 2. The second functional layer belt 61 is formed over the row-type first electrode layer separation grooves 21*c*. Further, the second functional layer 6 is stacked on and filled in the column-type first electrode layer separation grooves 20*a* that have been covered with the masks in the first functional layer forming process, thereby forming a plurality of second functional layer belts 61 on the substrate 2 aligned in the crosswise direction W.

The second functional layer belts 61 are formed at predetermined intervals in the crosswise direction W. The second functional layer belts 61 covers a projected plane in the member thickness direction of the regions A and C, while the first electrode layer 3 is exposed in a part of the regions B and D.

The second functional layer 6 has an average thickness of 50 nm to 250 nm preferably and 120 nm to 200 nm more preferably.

Herein, the second functional layer 6 is not stacked on the extraction regions 35 to 38 (see FIG. 10).

Thereafter, the electrode connection grooves 23 and 24 are formed on the resulting substrate 2, on which the second functional layer 6 has been formed, by using the laser scribing device (electrode connection groove forming process) as shown in FIG. 13.

At this time, the electrode connection grooves 23 and 24 are formed linearly in the lengthwise or crosswise direction so as to form a grid pattern. The electrode connection grooves 24 (column-type electrode connection grooves 24*a* and 24*b*) are formed in parallel with the column-type first electrode layer separation grooves 20*a* to 20*c*, while the electrode connection grooves 23 (row-type electrode connection grooves 23*a* and 23*b*) are formed in parallel with the row-type first electrode layer separation grooves 21*a* to 21*c*. On the resulting substrate 2, the column-type electrode connection grooves 24*a* are formed adjacent to and in parallel with the column-type first electrode layer separation grooves 20*a*, while the column-type electrode connection grooves 24*b* are formed adjacent to and in parallel with the column-type first electrode layer separation grooves 20*b*. Further, the row-type electrode connection grooves 23*a* are formed adjacent to and in parallel with the row-type first electrode layer separation grooves 21*a*, while the mw-type electrode connection grooves 23*b* are formed adjacent to and in parallel with the row-type first electrode layer separation grooves 21*b*.

Figure 14:
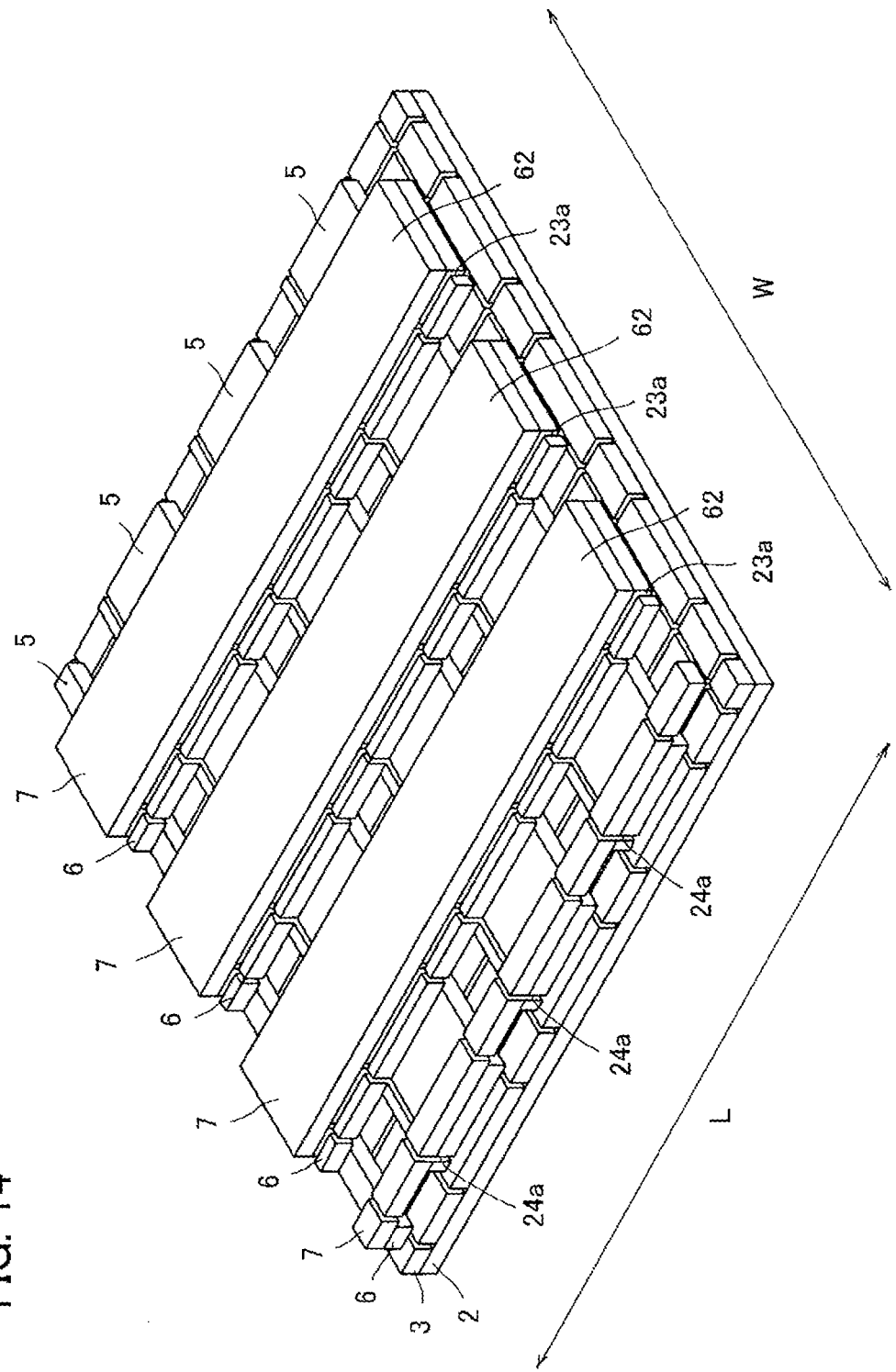
FIG. 14 is an explanatory diagram showing the manufacturing process of the organic EL device in FIG. 1, being a schematic diagram at the end of a second electrode layer forming process, the same layer being described on the same plane to facilitate understanding.

Next, on the resulting substrate 2, a plurality of rectangular masks adapted to cover in the whole lengthwise direction each are arranged between the row-type electrode connection groove 23*a* and the row-type electrode connection groove 23*b* and the second electrode layer 7 is formed as shown in FIG. 14 (second electrode layer forming process). As described above, the second electrode layer serves as the rear face-side electrode layer.

At this time, as shown in FIG. 14, strip-like second electrode layer belts 62 each composed of the second electrode layer 7 are formed on the first electrode layer 3 and the second functional layer 6 and extend in the lengthwise direction L. The second electrode layer belts 62 are formed on the second functional layer belts 61 and between the row-type electrode connection groove 23*a* and the row-type electrode connection groove 23*a* adjacent thereto, respectively. Specifically, the second electrode layer belts 62 cross with the first functional layer belts 60. In this embodiment, the second functional layer belts 61 intersect perpendicularly with the first functional layer belts 60 on the substrate 2.

Further, in the resulting substrate 2, the second electrode layer 7 is stacked on and filled in the column-type electrode connection grooves 24*a* and 24*b* formed in the second functional layer belts 61 and the strip-like second electrode layer 7 is stacked also on the regions except the regions where the masks have been arranged. Thus, as shown in FIG. 4, the first electrode layer 3 and the second electrode layer 7 are adhered at the bottoms of the column-type electrode connection grooves 24*a* and 24*b* with the both layers 3 and 7 be in contact with each other, so as to be electrically connected to each other.

The second electrode layer 7 has an average thickness of 100 nm to 300 nm preferably and of 150 nm to 200 nm more preferably.

Herein, the second electrode layer 7 is not stacked on the extraction regions 35 to 38 (see FIG. 10).

Figure 15:
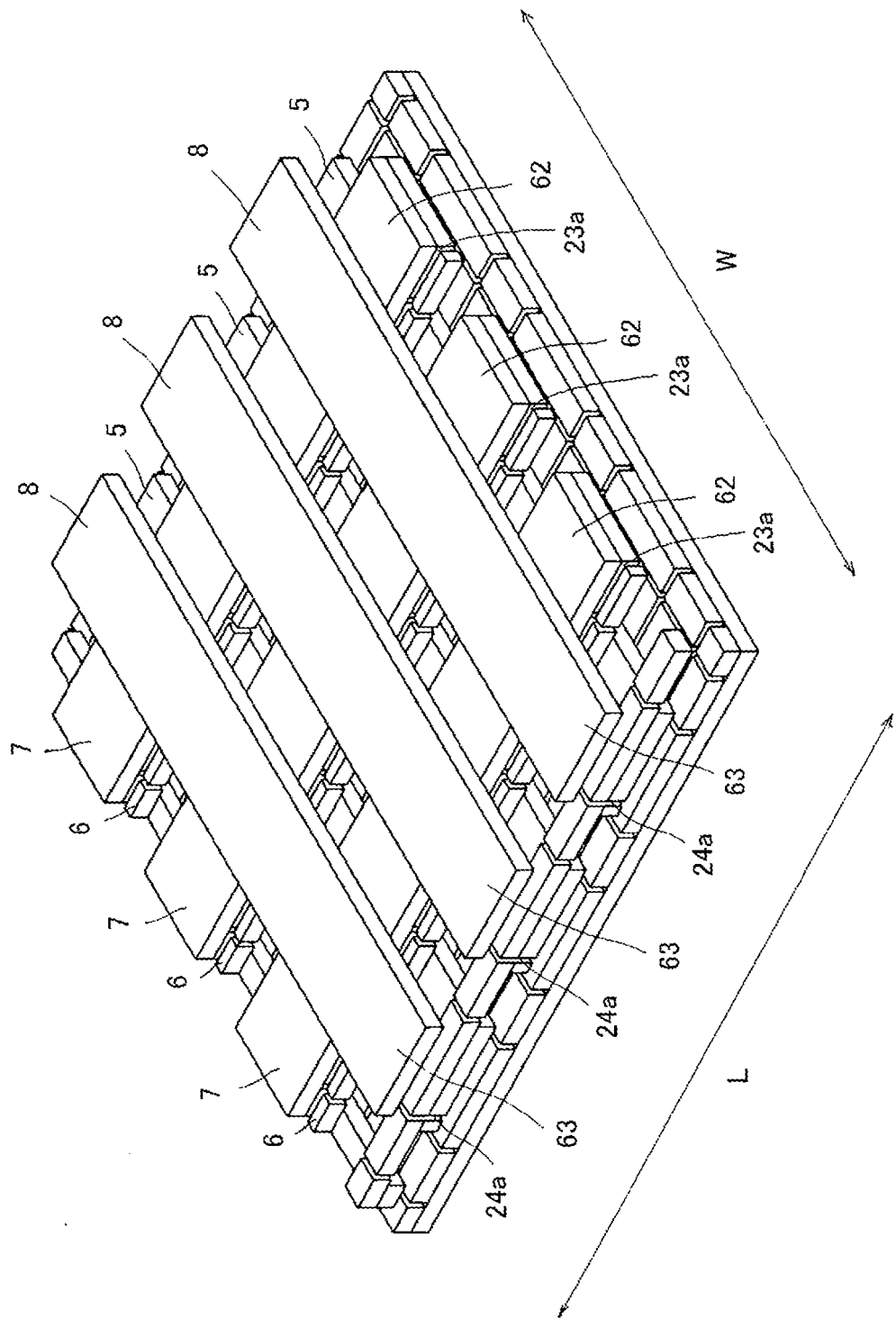
FIG. 15 is an explanatory diagram showing the manufacturing process of the organic EL device in FIG. 1, being a schematic diagram at the end of a third electrode layer forming process, the same layer being described on the same plane to facilitate understanding.

Next, a plurality of rectangular masks adapted to cover in the whole crosswise direction W each are arranged between the column-type electrode connection groove 24*a* and the column-type electrode connection groove 24*a* on the resulting substrate 2 and the third electrode layer 8 is formed (third electrode layer forming process) as shown in FIG. 15. As described above, the third electrode layer 8 serves as the rear face-side electrode layer.

At this time, as shown in FIG. 15, strip-like third electrode layer belts 63 each composed of the third electrode layer 8 are formed on the first electrode layer 3, the second functional layer 6, and the second electrode layer 7, and extend in the crosswise direction W. The third electrode layer belts 63 are formed above the first functional layer belt 60 respectively and between the column-type electrode connection groove 24*b* and the column-type electrode connection groove 24*b* adjacent thereto. Specifically, the third electrode layer belts 63 cross with the second electrode layer belts 62. In this embodiment, the third electrode layer belts 63 intersect perpendicularly with the second electrode layer belts 62 above the substrate 2.

Further, at this time, the third electrode layer 8 is stacked on and filled in the row-type electrode connection grooves 23*a* in the first functional layer belts 60 and the third electrode layer 8 is further stacked on the regions except the regions where the masks have been arranged. Thus, as shown in FIG. 3, the first electrode layer 3 and the third electrode layer 8 are adhered at the bottoms of the row-type electrode connection grooves 23*a* with the both layers 3 and 8 be in contact with each other, so as to be electrically connected to each other.

The third electrode layer 8 has an average thickness of 100 nm to 300 nm preferably and of 150 nm to 200 nm more preferably.

Herein, the third electrode layer 8 is not stacked on the extraction regions 35 to 38 (see FIG. 10).

Thereafter, the unit organic EL element separation grooves 26*a*, 26*b*, 27*a*, and 27*b* are formed on the resulting substrate 2, on which the third electrode layer 8 has been formed, by using the laser scribing device (organic EL element separation groove forming process) as shown in FIG. 16.

At this time, the unit organic EL element separation grooves 26*a*, 26*b*, 27*a*, and 27*b* are formed in parallel with the first electrode layer separation grooves 21, 21, 20, and 20 respectively in the whole longitudinal directions. The unit organic EL element separation grooves 26*a*, 26*b*, 27*a*, and 27*b*, as shown in FIGS. 2 and 8, divide the organic EL element 12 into a plurality of the unit organic EL elements 15, so as to form a plurality of the unit organic EL element regions 55. Specifically, the unit organic EL element separation grooves 26a and 26b are formed at the boundary between the row-type organic EL element region 51 and the crossing organic EL element region 50 and at the boundary between the row-type organic EL element region 51 and the non-organic EL element region 53, while the unit organic EL element separation grooves 27a and 27b are formed at the boundary between the column-type organic EL element region 52 and the crossing organic EL element region 50 and the boundary between the column-type organic EL element region 52 and the non-organic EL element region 53.

Figure 17:
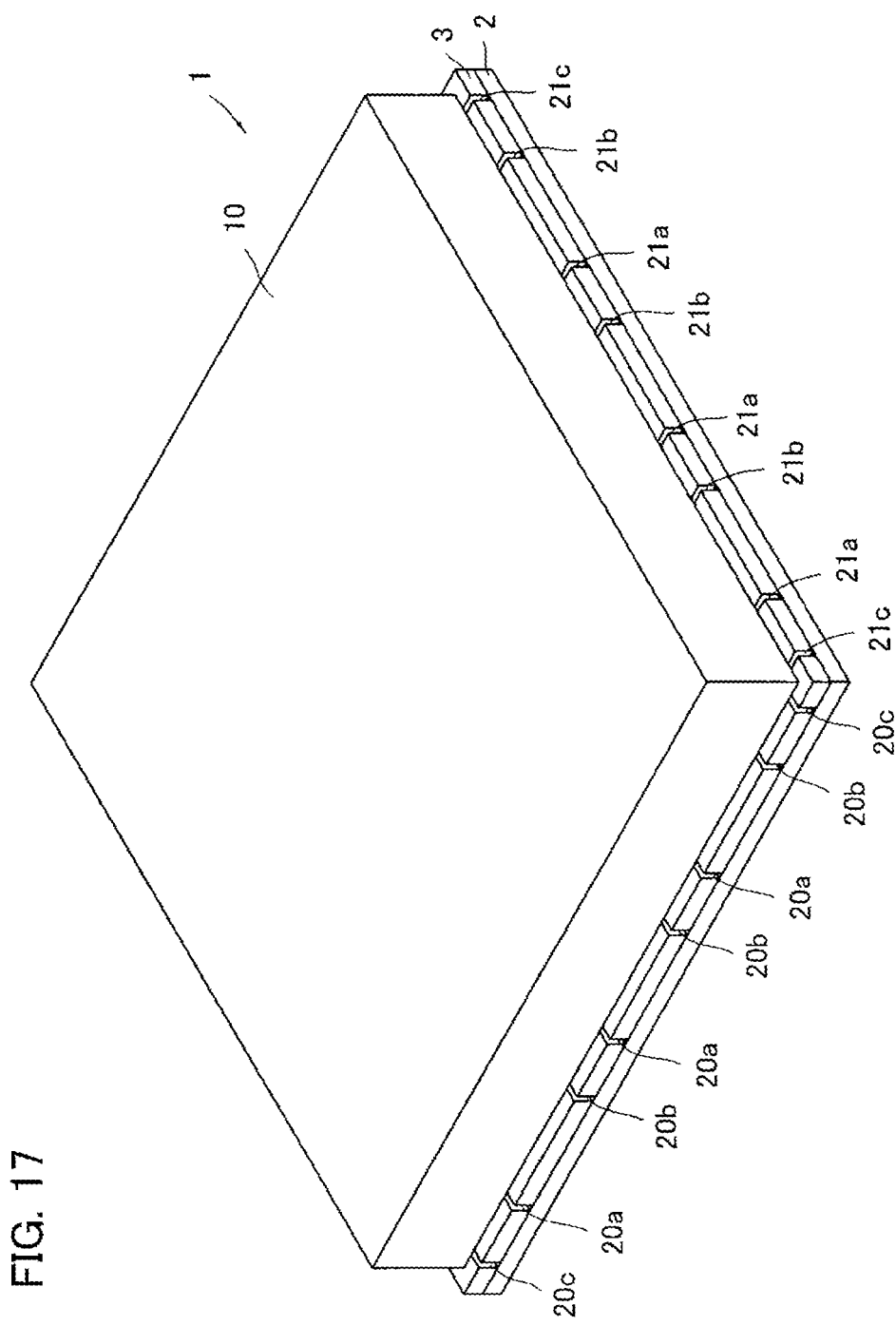
FIG. 17 is an explanatory diagram showing the manufacturing process of the organic EL device in FIG. 1, being a schematic diagram at the end of an insulation layer forming process.

Next, the insulation layer 10 is formed on the resulting substrate 2 by the CVD device (insulation layer forming process) as shown in FIG. 17.

At this time, the insulation layer 10 is stacked on the substantially entire area, so that the insulation layer 10 is stacked on and filled in the unit organic EL element separation grooves 26 and 27. The insulation layer 10 is also stacked on the entire area of the resulting substrate 2. Specifically, the unit organic EL element regions 55 each are an electrically-independent region except the first electrode layer 3.

Further, the insulation layer 10 has an average thickness of 5 μm to 100 μm preferably and 10 μm to 50 μm more preferably.

Herein, the insulation layer 10 is not stacked on the extraction regions 35 to 38 (see FIG. 10).

Then, the power supply electrode 56 is attached so as to cross over the extraction regions 35 and 37, while the power supply electrode 57 is attached so as to cross over the extraction regions 36 and 38. Thereby, the organic EL device 1 as shown in FIG. 1 is completed. The power supply electrodes 56 and 57 are connected to the first electrode layer 3 exposed from the periphery of the substrate 2 by a known connection means such as soldering and are conducting members bringing parts of the first electrode layer 3 exposed at the two sides including the corner of the substrate 2 into electrical contact.

At this time, the power supply electrode 56 is attached to the substantially entire area of the extraction regions 35 and 37 (in front of the column-type first electrode layer separation groove 20c), while the power supply electrode 57 is attached to the substantially entire area of the extraction regions 36 and 38 (in front of the row-type first electrode layer separation groove 21c).

Now, the flow of electric current when the device 1 is connected to an AC power source will be described below.

Herein, the description below illustrates a case in which the AC power source is connected to the device 1 as shown in FIG. 18.

In a circuit shown in FIG. 18, one of terminals of the AC power source is connected to the power supply electrode 56, while the other of terminals of the AC power source is connected to the power supply electrode 57.

Herein, the unit organic EL elements 15 each have a pn junction. The organic EL element columns and rows 16 and 17 each are formed by serially connecting the pn junctions of the unit organic EL elements 15 belonging to those. The organic EL device 1 in this embodiment has the quadrangular substrate 2. The first electrode layer 3 being in electrical contact with a p-side of the organic EL element column 16 and with an n-side of the organic EL element row 17 is exposed at the two sides including one corner of the substrate.

Further, the first electrode layer 3 being in electrical contact with an n-side of the organic EL element column 16 and with a p-side of the organic EL element row 17 is exposed at the other two sides including an opposed corner of the substrate 2.

Thus, the power supply electrode 57 brings the p-side power supply parts of the organic EL element rows 17 and the n-side power supply parts of the organic EL element columns 16 in electrical contact with each other.

Further, the power supply electrode 56 brings the p-side power supply parts of the organic EL element columns 16 and the n-side power supply parts of the organic EL element rows 17 in electrical contact with each other.

Therefore, the p-side power supply parts of the organic EL element rows 17 and the n-side power supply parts of the organic EL element columns 16 are connected to the AC power source in parallel. The p-side power supply parts of the organic EL element columns 16 and the n-side power supply parts of the organic EL element rows 17 are connected to the AC power source in parallel.

Figure 19:
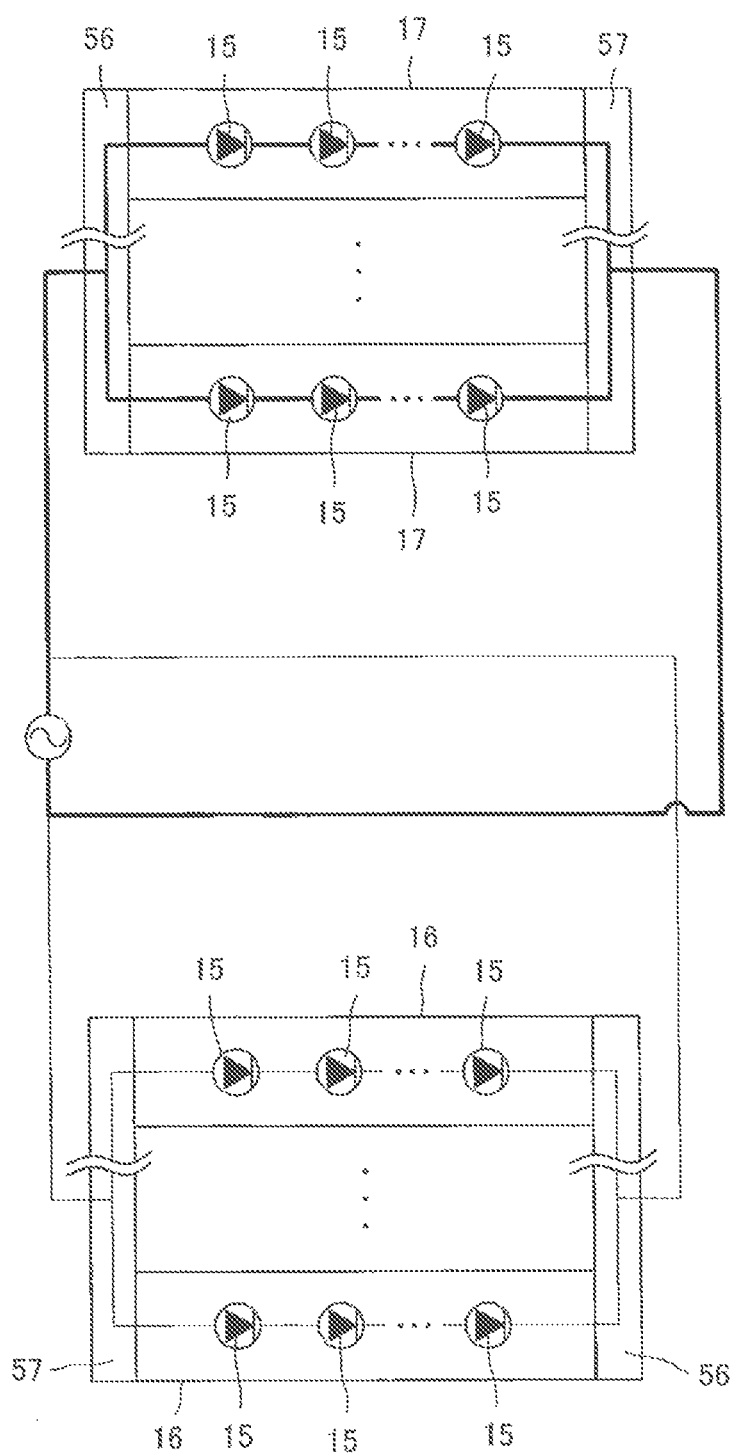
FIG. 19 is an electric circuit when the organic EL device in FIG. 18 is connected to the AC power source with a conductive path in which electric current flows in a forward direction indicated by a thick line.

Then, firstly as shown in FIG. 19, when electric current is flowed to the pn junctions of the organic EL element rows 17 in a forward direction, the supplied electric current flows through a conductive path from the power supply electrode 56 through the organic EL element rows 17 to the power supply electrode 57 in the crosswise direction. Specifically, the organic EL device 1 is connected to the AC power source, so that the electric current flows to the pn junctions of the organic EL element rows 17 in the forward direction during a half cycle, as shown in FIG. 19.

Figure 20:
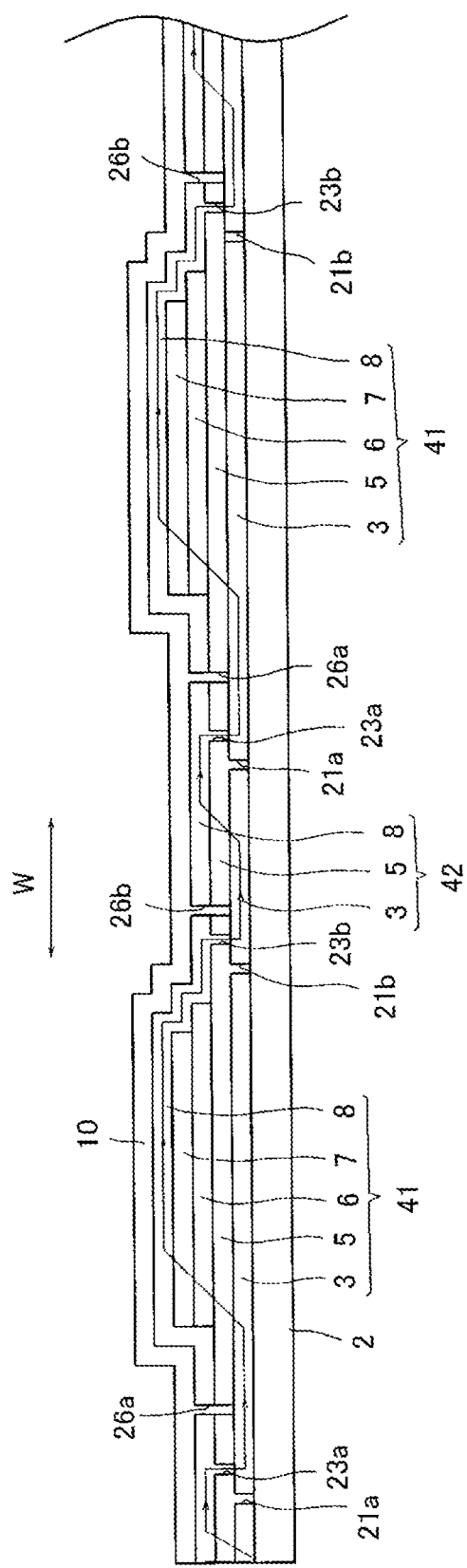
FIG. 20 is an explanatory diagram showing the flow of electric current in the organic EL device in FIG. 18, the flow of electric current being indicated by an arrow in FIG. 3.

At this time, in the organic EL element rows 17, the electric current is transferred from the power supply electrode 56 to the first electrode layer 3 of the extraction region 38, through the first electrode layer 3, and further to the first electrode layer 3 of the row-type unit organic EL element 42, then reaching the third electrode layer 8 through the first functional layer 5 in the row-type unit organic EL element 42 as shown in FIG. 20. At this time, the first functional layer 5 of the row-type unit organic EL element 42 emits light.

The electric current having reached the third electrode layer 8 of the row-type unit organic EL element 42 is transferred through the row-type electrode connection groove 23a to the first electrode layer 3 of the adjacent crossing unit organic EL element 41. The electric current having been transferred to the first electrode layer 3 of the crossing unit organic EL element 41 reaches the third electrode layer 8 through the first functional layer 5, the second functional layer 6, and the second electrode layer 7 in the crossing unit organic EL element 41. At this time, the first functional layer 5 and the second functional layer 6 emit light.

Further, the electric current having reached the third electrode layer 8 of the crossing unit organic EL element 41 is transferred to the first electrode layer 3 in the adjacent row-type unit organic EL element 42 through the row-type electrode connection groove 23b.

In this way, the supplied electric current passes alternately through the row-type unit organic EL element 42 and the crossing unit organic EL element 41. The electric current having reached the third electrode layer 8 of the row-type unit organic EL element 42 is transferred to the first electrode layer 3 of the extraction region 37 and further to the power supply electrode 57.

Figure 21:
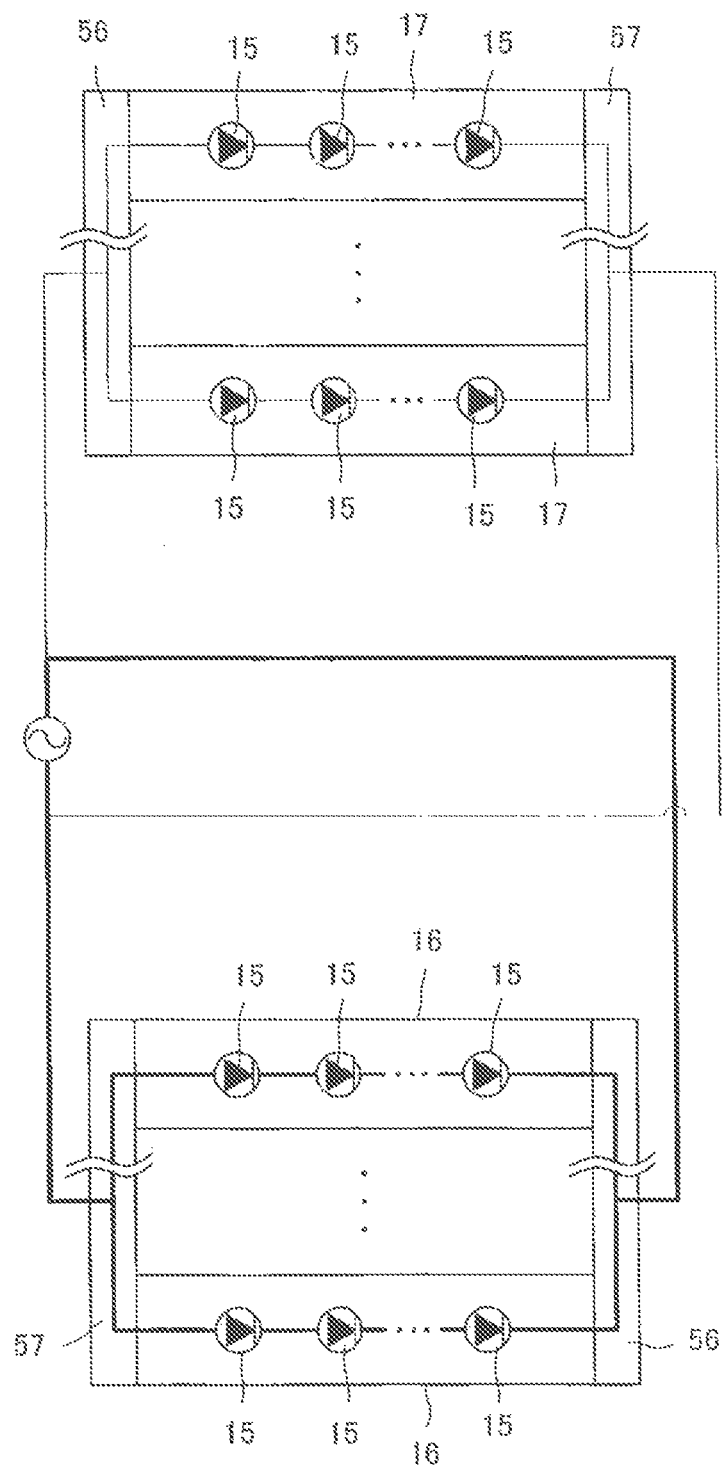
FIG. 21 is an electric circuit when the organic EL device in FIG. 18 is connected to the AC power source with a conductive path in which electric current flows in a backward direction indicated by a thick line.

In contrast, when the electric current is flowed in the reverse direction or in a backward direction as shown in FIG. 21, the supplied electric current flows through a conductive path from the power supply electrode 57 through the organic EL element columns 16 to the power supply electrode 56 in the lengthwise direction.

Figure 22:
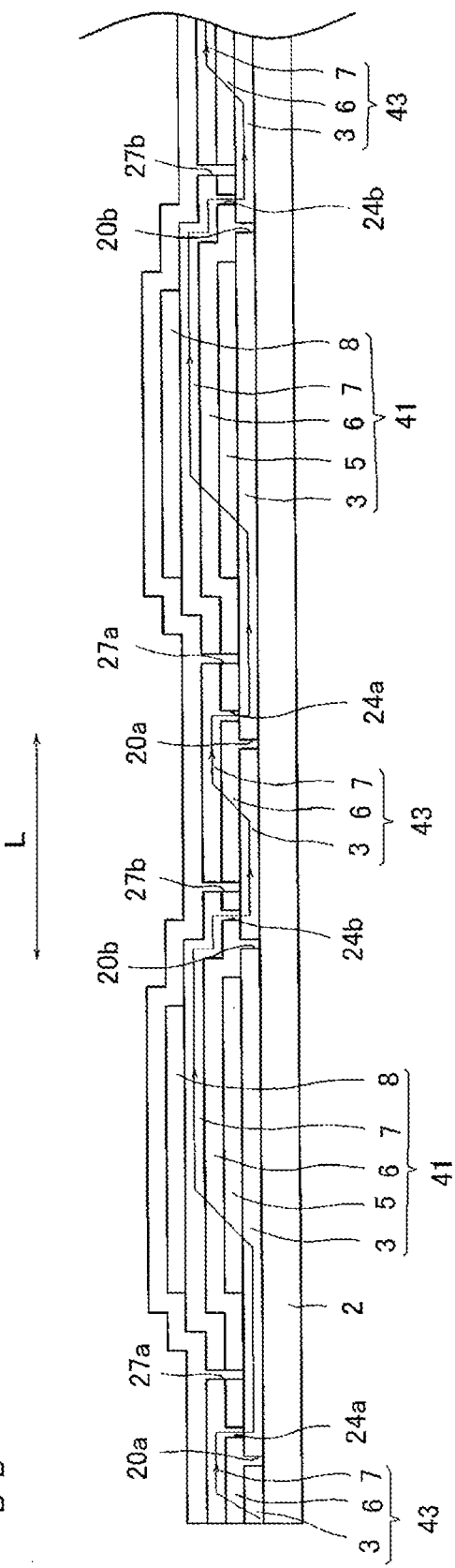
FIG. 22 is an explanatory diagram showing a flow of electric current in the organic EL device in FIG. 18, the flow of electric current being indicated by an arrow in FIG. 4.

At this time, in the organic EL element columns 16, the electric current is transferred from the power supply electrode 57 to the first electrode layer 3 of the extraction region 35, through the first electrode layer 3, and further to the first electrode layer 3 of the column-type unit organic EL element 43, then reaching the second electrode layer 7 through the second functional layer 6 in the column-type unit organic EL element 43 as shown in FIG. 22. At this time, the second functional layer 6 of the column-type unit organic EL element 43 emits light.

The electric current having reached the second functional layer 6 of the column-type unit organic EL element 43 is transferred through the column-type electrode connection groove 24a to the first electrode layer 3 of the adjacent crossing unit organic EL element 41. The electric current having been transferred to the first electrode layer 3 of the crossing unit organic EL element 41 reaches the second electrode layer 7 through the first functional layer 5 and the second functional layer 6 in the crossing unit organic EL element 41. At this time, the first functional layer 5 and the second functional layer 6 emit light.

Further, the electric current having reached the second electrode layer 7 of the crossing unit organic EL element 41 is transferred through the column-type electrode connection groove 24b to the first electrode layer 3 in the adjacent column-type unit organic EL element 43.

In this way, the supplied electric current passes alternately through the column-type unit organic EL element 43 and the crossing unit organic EL element 41. The electric current having reached the second electrode layer 7 of the column-type unit organic EL element 43 is transferred to the first electrode layer 3 of the extraction region 37 and further to the power supply electrode 56.

As described above, when the organic EL device 1 in this embodiment is connected to the AC power source, the first functional layer 5 or the second functional layer 6 of the crossing organic EL element region 50 where the conductive paths cross with each other emits light, so that the crossing unit organic EL element 41 continuously emits light. That prevents decrease in brightness and flickering experienced by users even when cycles of the AC power source are changed.

When the organic EL device 1 is connected to a DC power source, the organic EL device 1 emits light planarly in any case of electric current flowing in a forward direction or in a backward direction. Therefore, users can use the organic EL device 1 as lighting equipment without paying much attention to positive and negative poles of the DC power source.

A layer configuration of the organic EL element 12 in the first embodiment will be further described in detail below.

The substrate 2 has translucency and insulation properties. A material of the substrate 2 is not particularly limited, but may be appropriately selected from materials such as a flexible film substrate and a plastic substrate. Especially, a glass substrate or a transparent film substrate is suitable in view of good transparency and workability.

A material of the first electrode layer 3 is not particularly limited only if having transparency and conductivity and may use a metal oxide such as indium tin oxide (ITO), indium zinc oxide (IZO), tin oxide ($SnO_2$), zinc oxide (ZnO), for example. ITO or IZO having high transparency is particularly preferable since light generated from the light-emitting layers in the first functional layer 5 and the second functional layer 6 can be efficiently extracted. This embodiment employs ITO.

The first functional layer 5 and the second functional layer 6 are located between the first electrode layer 3 and the second electrode layer 7 or the third electrode layer 8 and each include at least one light-emitting layer. The first functional layer 5 and the second functional layer 6 each are made up of a plurality of layers mainly composed of organic compounds. The first functional layer 5 and the second functional layer 6 can be formed of a known material such as a low molecular dye material or a conjugated high molecular material, which is used for a general organic EL device. The first functional layer 5 and the second functional layer 6 may have a laminated multilayer structure composed of a plurality of layers such as a hole injection layer, a hole transport layer, a light-emitting layer, an electron transport layer, and an electron injection layer.

Herein, the first functional layer 5 and the second functional layer 6 may have different layer structures.

The first functional layer 5 can use a light-emitting layer obtained by removing a red emitting dye from a white light-emitting layer, while the second functional layer 6 can use a light-emitting layer obtained by removing a blue emitting dye from a white light-emitting layer, for example. That allows light emission in different colors with the row-type unit organic EL element 42 including the first functional layer 5, the column-type unit organic EL element 43 including the second functional layer 6, and the crossing unit organic EL element 41 including both the first functional layer 5 and the second functional layer 6. In sum, the crossing unit organic EL element 41 continuously emitting light can emit white light that does not affect other color tones.

Materials of the second electrode layer 7 and the third electrode layer 8 are not particularly limited and may employ silver (Ag) or aluminum (Al), for example. The second electrode layer 7 and the third electrode layer 8 in this embodiment are made of Al.

The insulation layer may serve as a capacitor as an application of the above-mentioned first embodiment. Specifically, it is described in detail as a second embodiment. Herein, the same numerals are assigned to the same parts with those of the first embodiment and redundant description is omitted.

Figure 23:
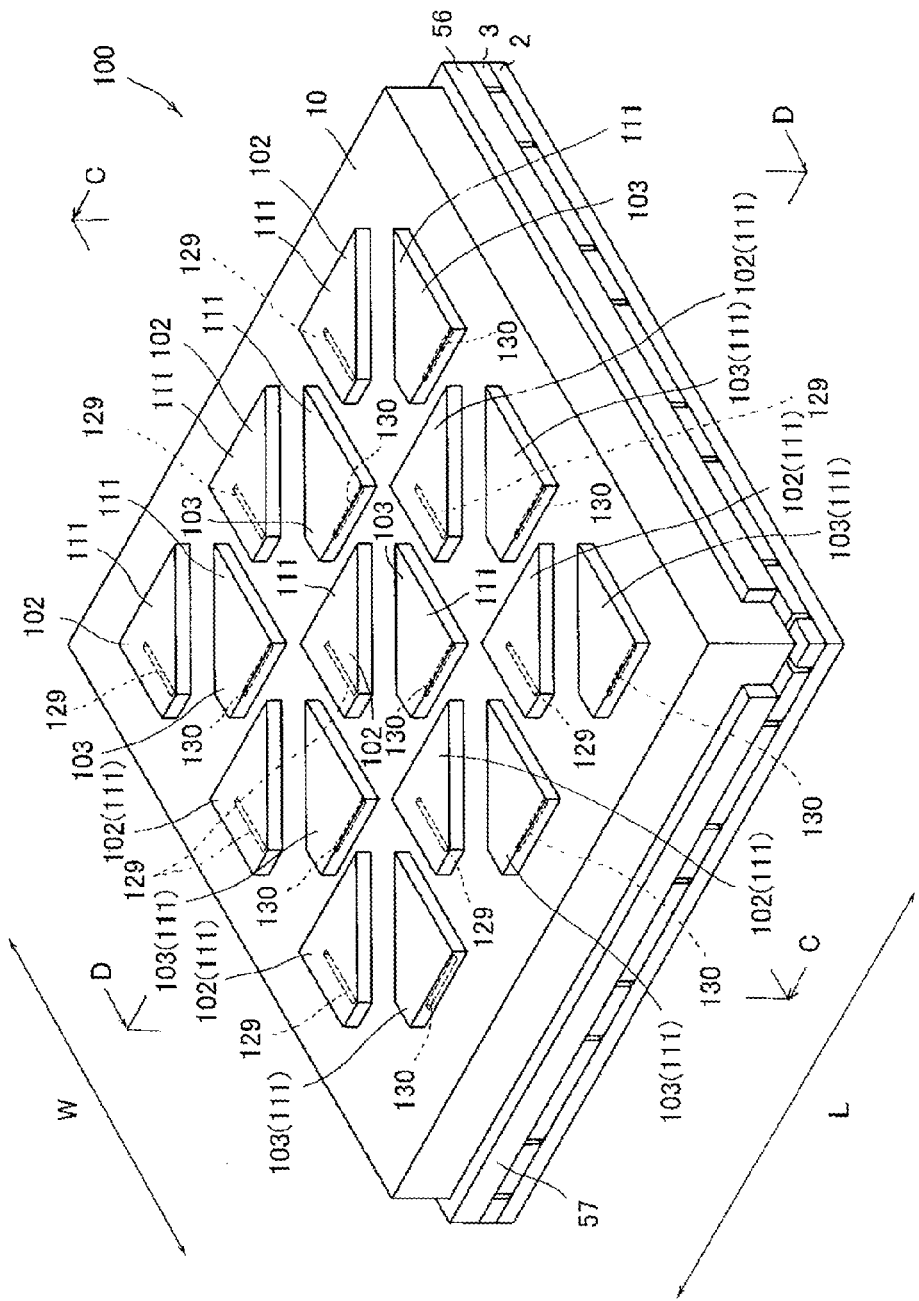
FIG. 23 is a perspective view of an organic EL device in a second embodiment of this invention.

Referring to FIG. 23, an organic EL device 100 in a second embodiment is formed of a stack of a fourth electrode layer 111 on the insulation layer 10 in addition to the configuration of the organic EL device 1 described above.

Electrode parts 102 and 103 formed of the fourth electrode layer 111 are arranged on the insulation layer 10.

The electrode parts 102 and 103 each have a substantially triangle shape, a part of which is electrically connected to the first electrode layer 3.

Figure 24:
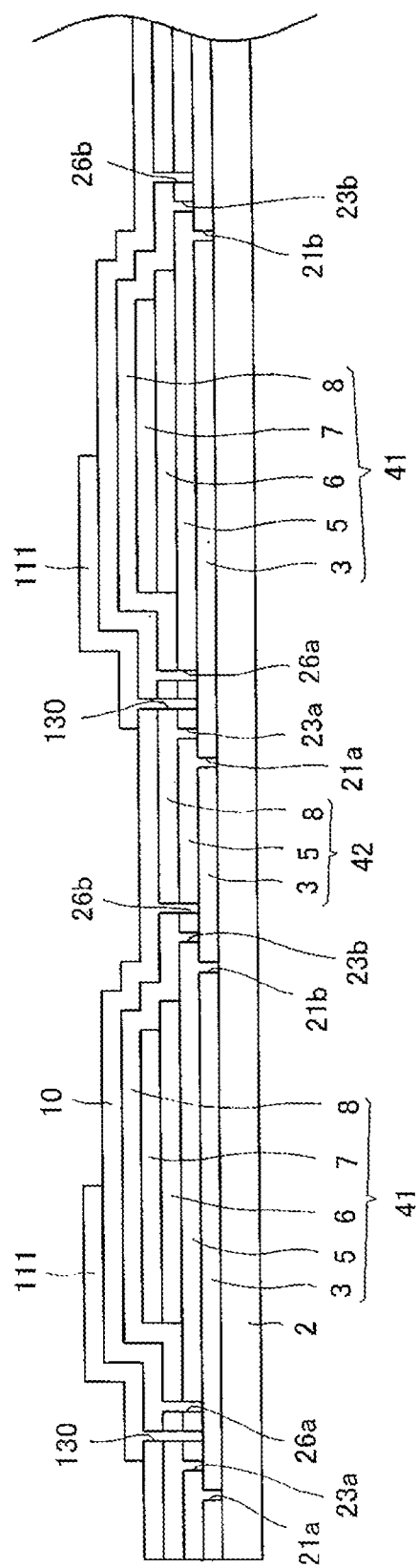
FIG. 24 is a cross section taken along a line C-C of the organic EL device in FIG. 23.
Figure 25:
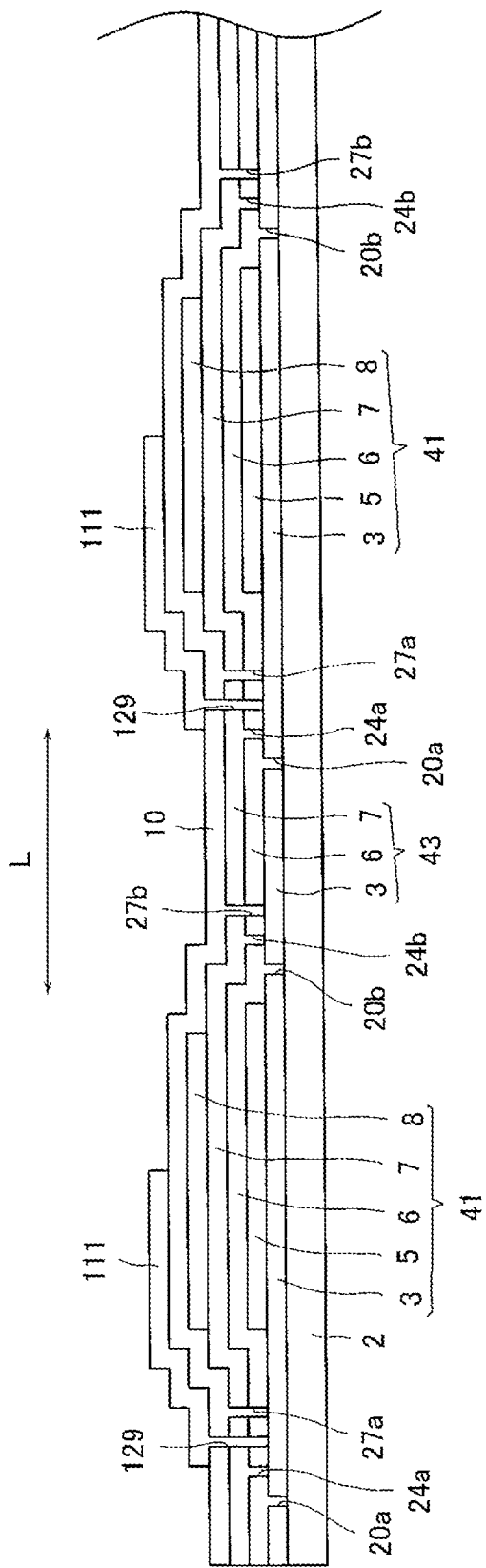
FIG. 25 is a cross section taken along a line D-D of the organic EL device in FIG. 23.

Insulation layer separation grooves 129 and 130 extend in the lengthwise/crosswise directions. The insulation layer separation grooves 130 each are formed by partially removing from the first functional layer 5, the third electrode layer 8, and the insulation layer 10 as shown in FIG. 24. Meanwhile, the insulation layer separation grooves 129 each are formed by partially removing from the second functional layer 6, the second electrode layer 7, and the insulation layer 10 as shown in FIG. 25.

The insulation layer separation grooves 129 and 130 are formed in parallel with the first electrode layer separation grooves 20 and 21, respectively. Further, a part of the fourth electrode layer 111 penetrates in the insulation layer separation grooves 129 and 130, so as to have contact with the first electrode layer 3 at the bottoms of the insulation layer separation grooves 129 and 130.

The insulation layer separation grooves 129 and 130 each have a groove width of 30 μm or more and 80 μm or less, preferably of 40 μm or more and 70 μm or less, and most preferably of 45 μm or more and 60 μm or less.

A material of the fourth electrode layer 111 is not particularly limited and may employ silver (Ag) or aluminum (Al), for example. The fourth electrode layer 111 in this embodiment is formed of Al.

The organic EL device 1 in the present embodiment has the non-organic EL element region 53 surrounded by at least two adjacent organic EL element columns 16 and at least two adjacent organic EL element rows 17 (see FIG. 8). In sum, the device 1 has the non-organic EL element region 53 where the second electrode layer 7 or the third electrode layer 8 is not continuous, so that short circuit is prevented between the adjacent organic EL element columns 16 and 16 or the adjacent organic EL element rows 17 and 17 due to no electrical contact with each other, respectively through the second electrode layer 7 or the third electrode layer 8.

Figure 36:
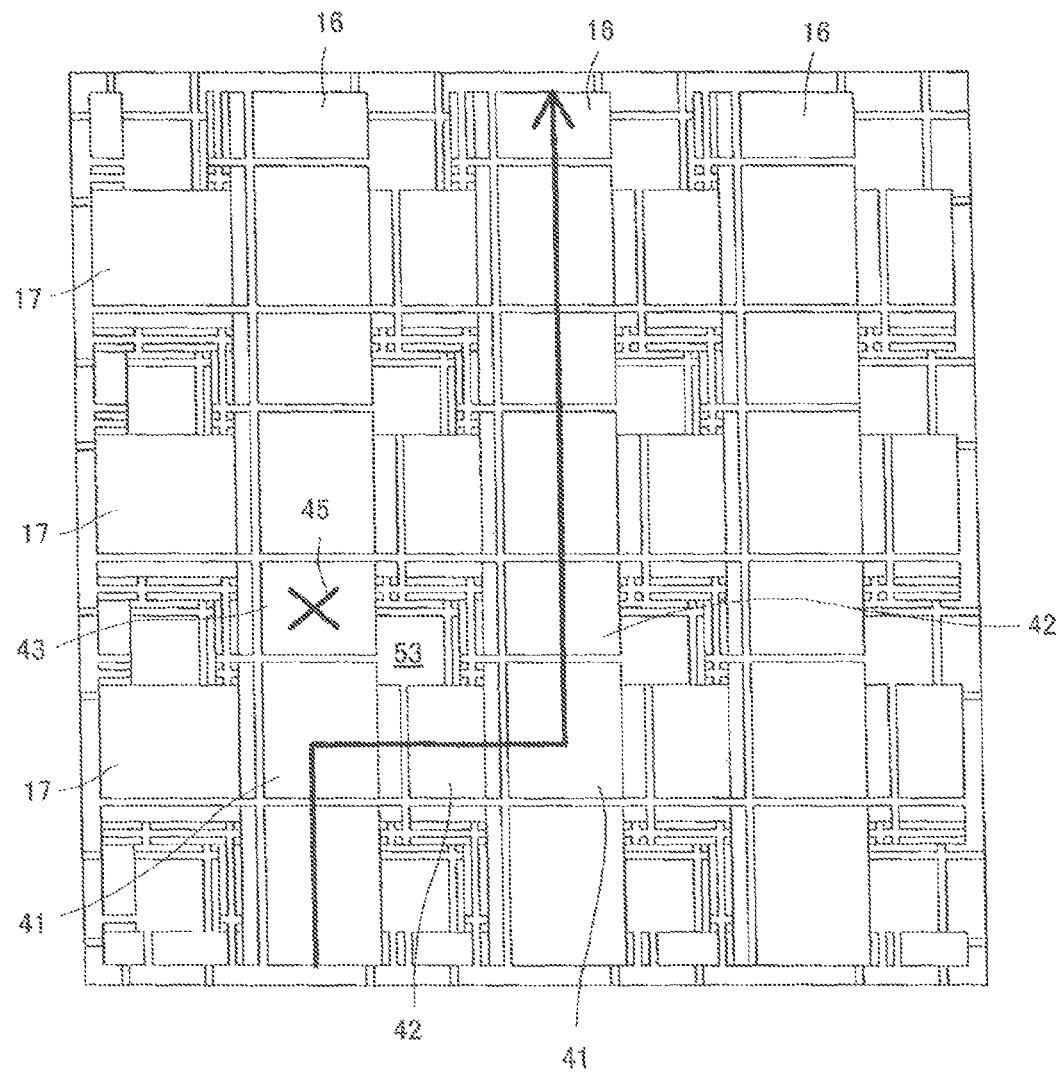
FIG. 36 is an explanatory diagram of the organic EL device in the first embodiment of this invention in which the conductive path is short-circuited, showing a flow of electric current by an arrow.

The organic EL device 1 in this embodiment includes the organic EL element columns 16 and the organic EL element rows 17 stacked in a grid pattern and the non-organic EL element region 53 sandwiched between two adjacent organic EL element rows 17 and 17. Thus, as shown in FIG. 36, for example, when a part of the column-type unit organic EL element 43 is deteriorated, forming a deteriorated part 45, resulting in disconnection of the conductive path in the organic EL element column 16, electric current having been supplied to the organic EL element column 16 is transmitted to the row-type unit organic EL element 42 from the crossing unit organic EL element 41 just before the deteriorated part, so as to be released to its adjacent organic EL element column 16. Therefore, the organic EL device 1 prevents the occurrence of non-emission as a whole and maintains the light emitting function.

Now a method for manufacturing the organic EL device 100 in the second embodiment will be described below. The description is omitted up until the insulation layer forming process because the manufacturing method until the insulation layer forming process of this embodiment is the same as that of the organic EL device 1 in the first embodiment described above.

Figure 26:
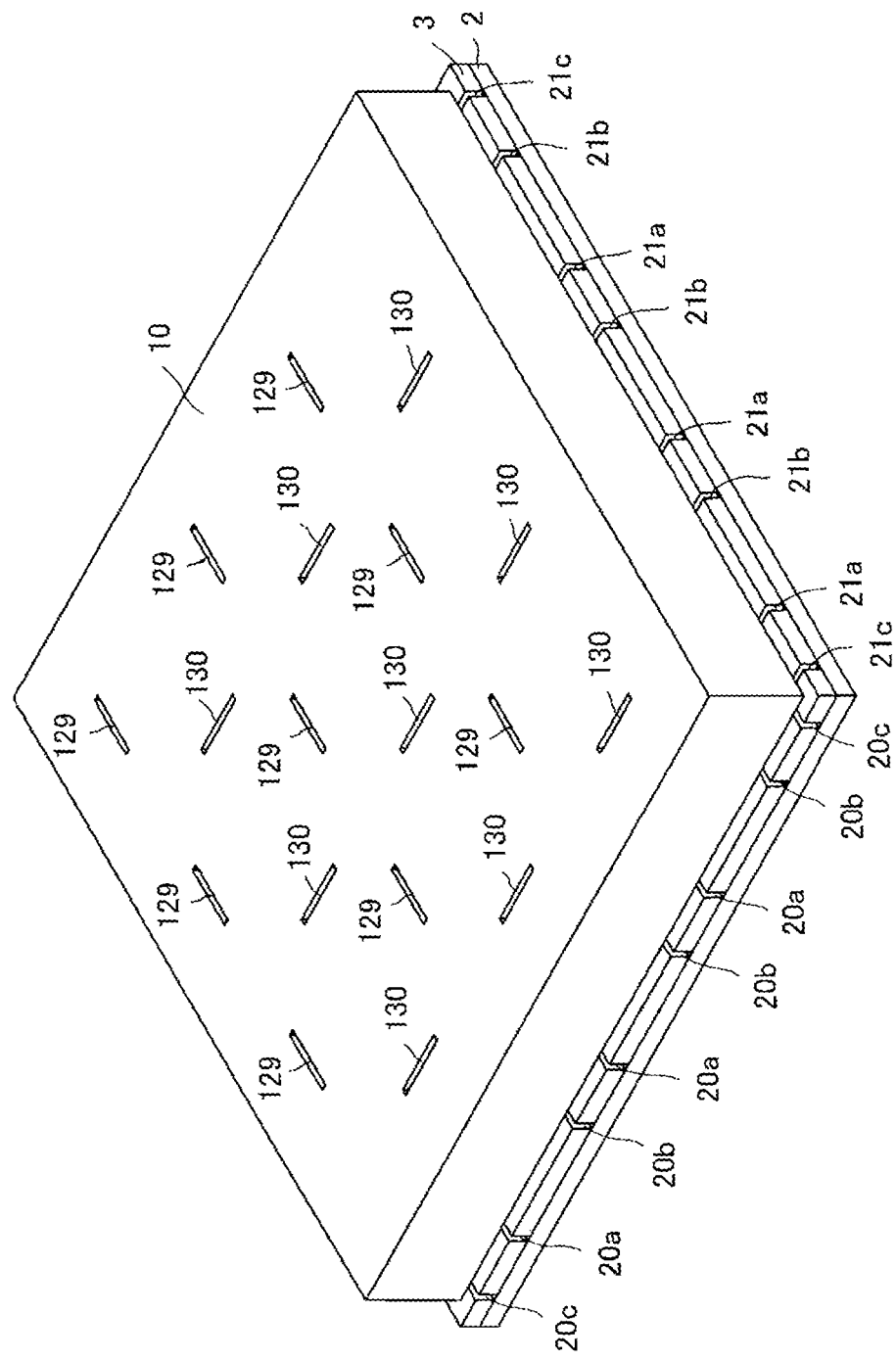
FIG. 26 is an explanatory diagram showing a manufacturing process of the organic EL device in FIG. 23, being a schematic diagram at the end of an insulation layer separation groove forming process.

By the laser scribing device, the insulation layer separation grooves 129 and 130 are formed on the resulting substrate 2, on which the insulation layer 10 is stacked in the insulation layer forming process as shown in FIG. 26 (insulation layer separation groove forming process).

Referring to FIG. 25, the insulation layer separation grooves 129 each are formed between the column-type electrode connection groove 24a extending in the crosswise direction and the unit organic EL element separation groove 27a extending in the crosswise direction. The insulation layer separation grooves 129 are formed in the column-type unit organic EL elements 43.

Meanwhile, referring to FIG. 24, the insulation layer separation grooves 130 each are formed between the row-type electrode connection groove 23a extending in the lengthwise direction and the unit organic EL element separation grooves 26a extending in the lengthwise direction. The insulation layer separation grooves 130 are formed in the row-type unit organic EL elements 42.

Figure 27:
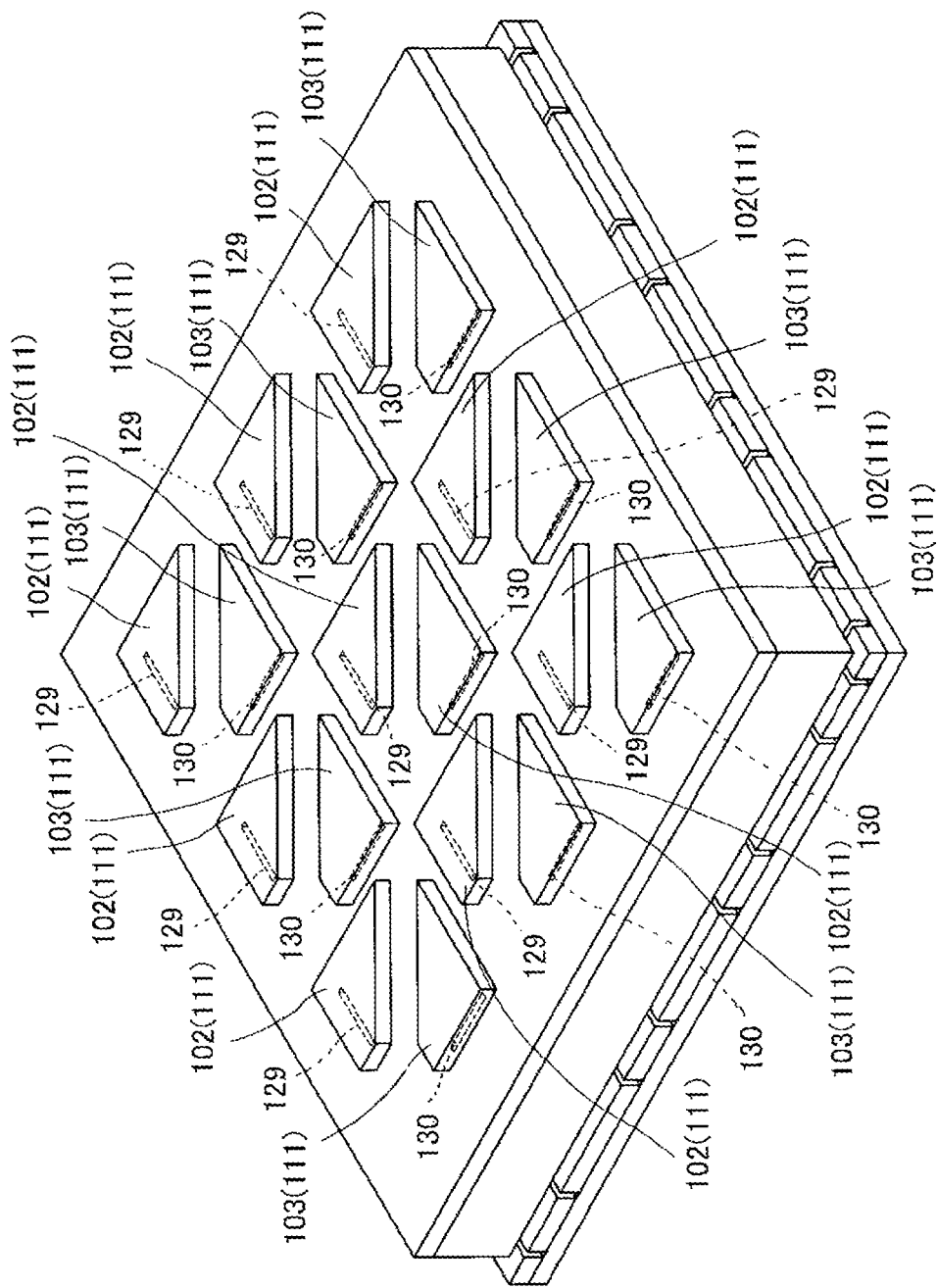
FIG. 27 is an explanatory diagram showing the manufacturing process of the organic EL device in FIG. 23, being a schematic diagram at the end of a fourth electrode layer forming process.

Next, the fourth electrode layer 111 is formed on the resulting substrate 2 by using the CVD device (fourth electrode layer forming process, dielectric electrode layer forming process) as shown in FIG. 27.

At this time, the electrode parts 102 and 103 formed of the fourth electrode layer 111 each are stacked on a projected plane in the member thickness direction of the crossing unit organic EL element 41.

The electrode parts 102 each are formed over the column-type organic EL element region 52 and the crossing organic EL element region 50 and mostly located at the crossing organic EL element region 50.

Meanwhile, the electrode parts 103 each are formed over the row-type organic EL element region 51 and the crossing organic EL element region 50 and mostly located at the crossing organic EL element region 50

Moreover, the electrode parts 102 and 103 are located so that their oblique sides oppose each other on the crossing organic EL element region 50.

Next, the flow of electric current when the device 100 is connected to an AC power source will be described below.

Herein, the description below illustrates a case in which the AC power source is connected to the device 100 as well as the description in the first embodiment. A basic conductive path is the same as that of the organic EL device 1 in the first embodiment, so that different parts will be mainly described in detail below.

Figure 28:
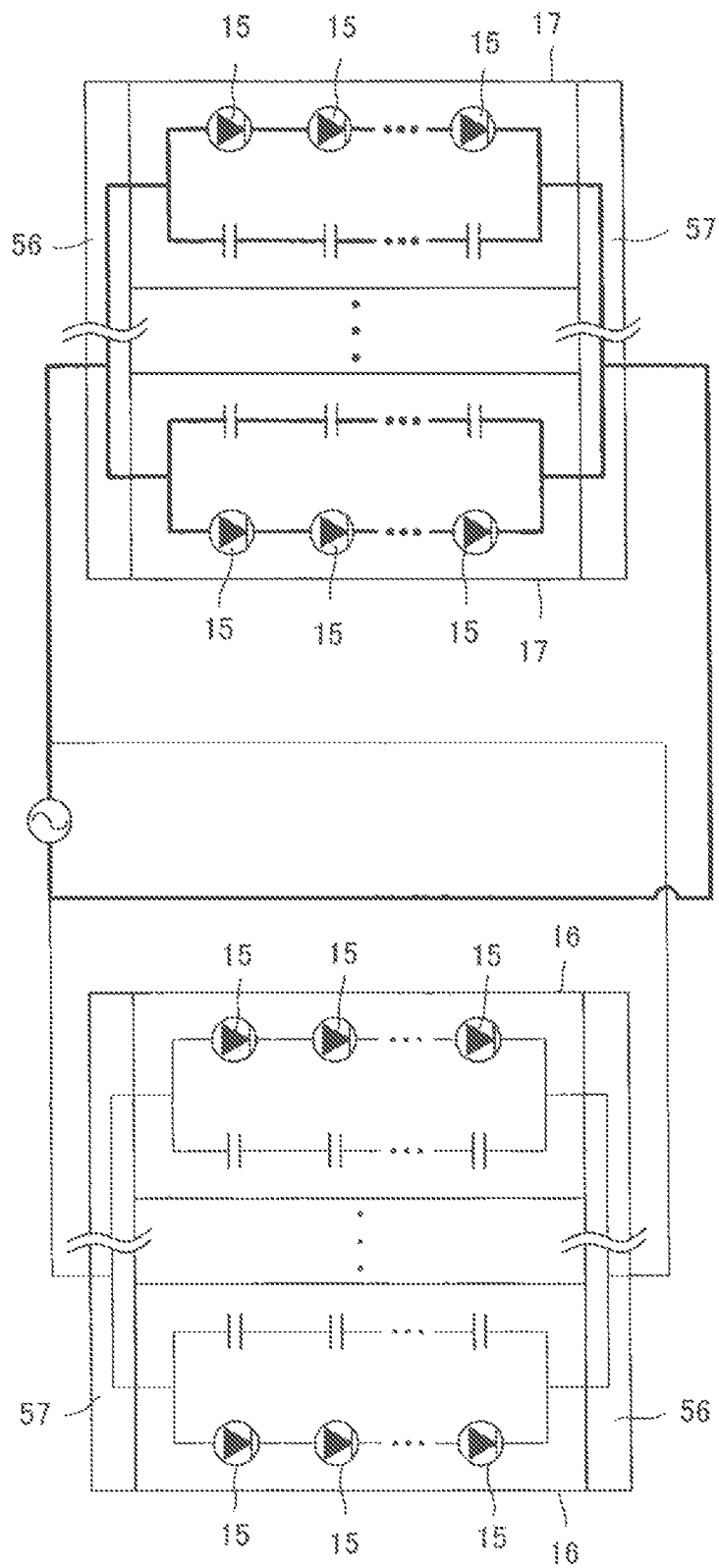
FIG. 28 is an electric circuit when the organic EL device in FIG. 23 is connected to an AC power source with a conductive path in which electric current flows in a forward direction indicated by a thick line.
Figure 29:
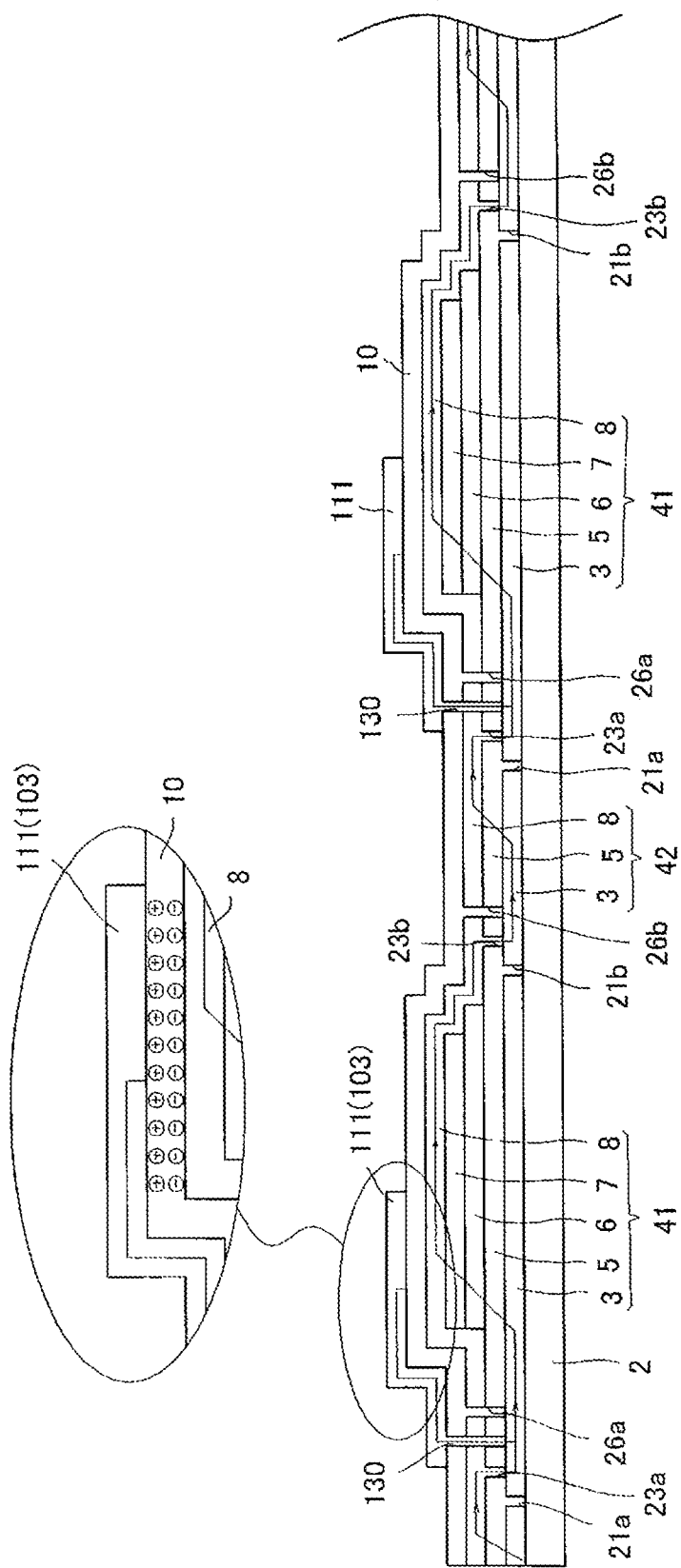
FIG. 29 is an explanatory diagram showing a flow of electric current in the organic EL device in FIG. 23, the flow of electric current when the electric current flows in a forward direction being indicated by an arrow in FIG. 24.

When electric current flows in a forward direction, the electric current having reached the first electrode layer 3 of the row-type unit organic EL element 42 is transmitted through the above-mentioned conductive path as shown in FIGS. 28 and 29. And in addition to this conductive path, the electric current is transmitted partly through the insulation layer separation grooves 130 to the fourth electrode layer 111 (electrode parts 103), and then electric charges are accumulated on a surface (near the fourth electrode layer 111) of the insulation layer 10 (dielectric layer) having contact with the fourth electrode layer 111.

Figure 30:
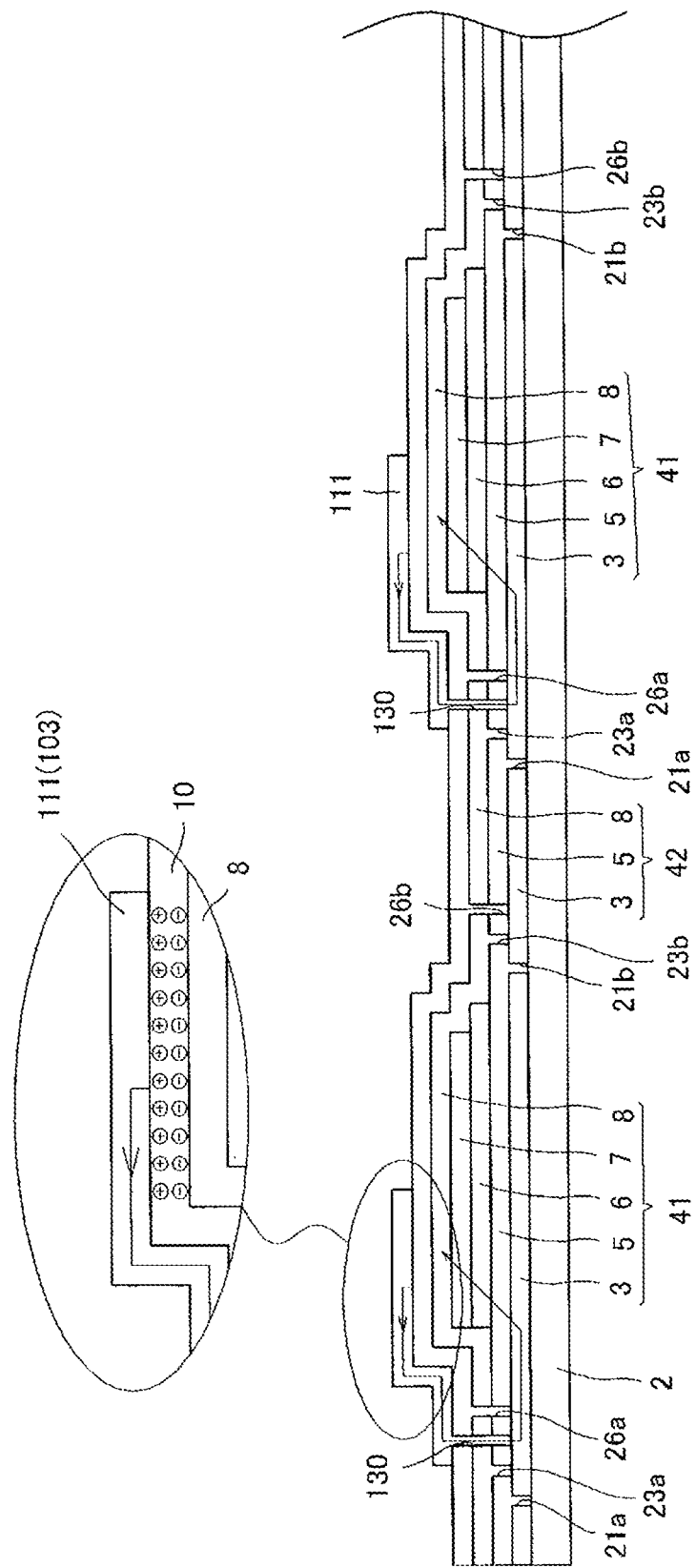
FIG. 30 is an explanatory diagram showing a flow of electric current in the organic EL device in FIG. 23, the flow of electric current upon switching of the electric current from the forward direction to the backward direction being indicated by an arrow in FIG. 24.

With this state, upon inversion of negative and positive poles due to a switching cycle of the AC power source, the electric current flows in a backward direction, as shown in FIG. 30, by the electric charges having been accumulated on the surface of the insulation layer 10 (near the fourth electrode layer 111), so as to be transmitted to the first electrode layer 3 in the crossing unit organic EL element 41 through the insulation layer separation grooves 130. The electric current further flows through the first electrode layer 3, the first functional layer 5, the second functional layer 6, and the second electrode layer 7 up to the third electrode layer 8 within the crossing unit organic EL element 41. At this time, the first functional layer 5 and the second functional layer 6 emit light. In sum, after the switching, the first functional layer 5 and the second functional layer 6 within the crossing unit organic EL elements 41 emit light for a predetermined period of time.

Figure 31:
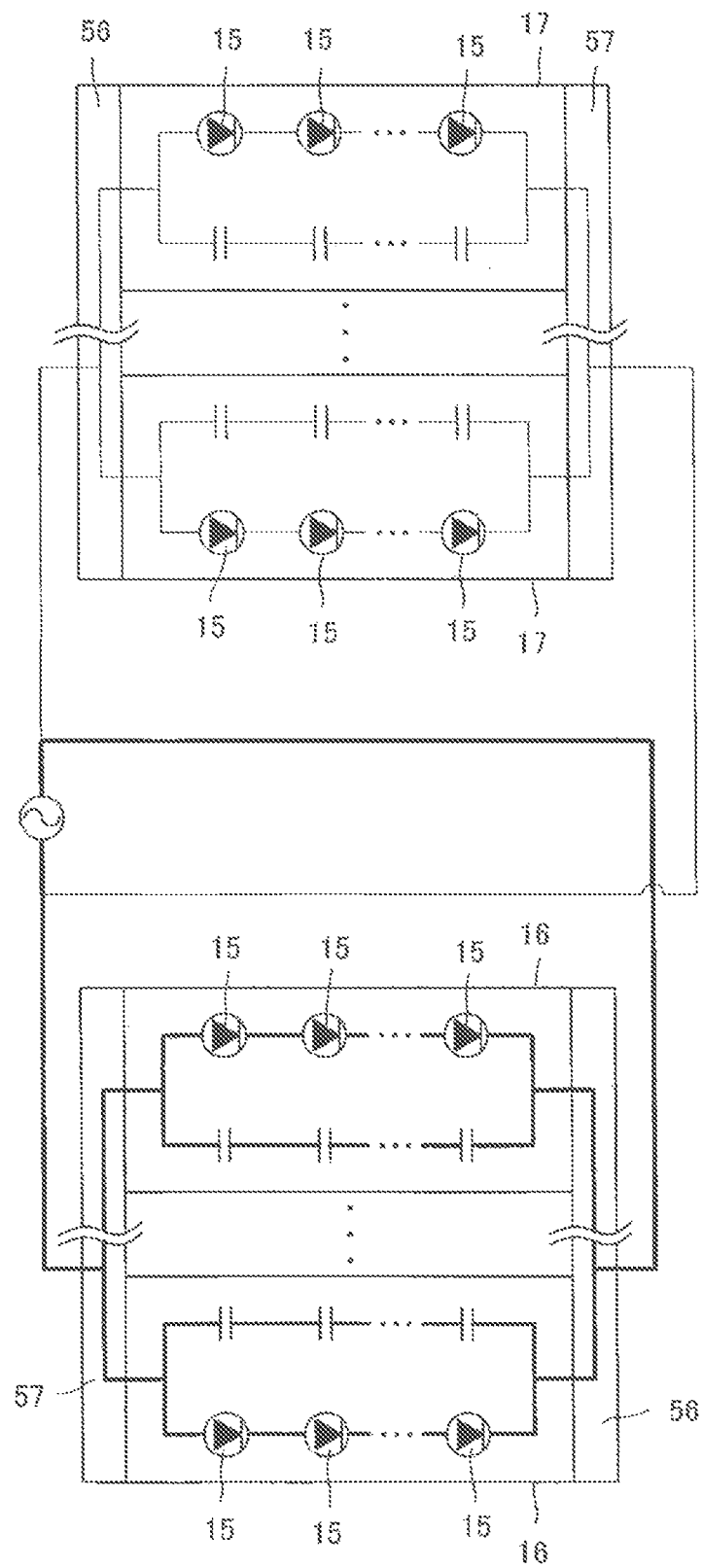
FIG. 31 is an electric circuit when the organic EL device in FIG. 23 is connected to the AC power source with a conductive path in which electric current flows in a backward direction indicated by a thick line.
Figure 32:
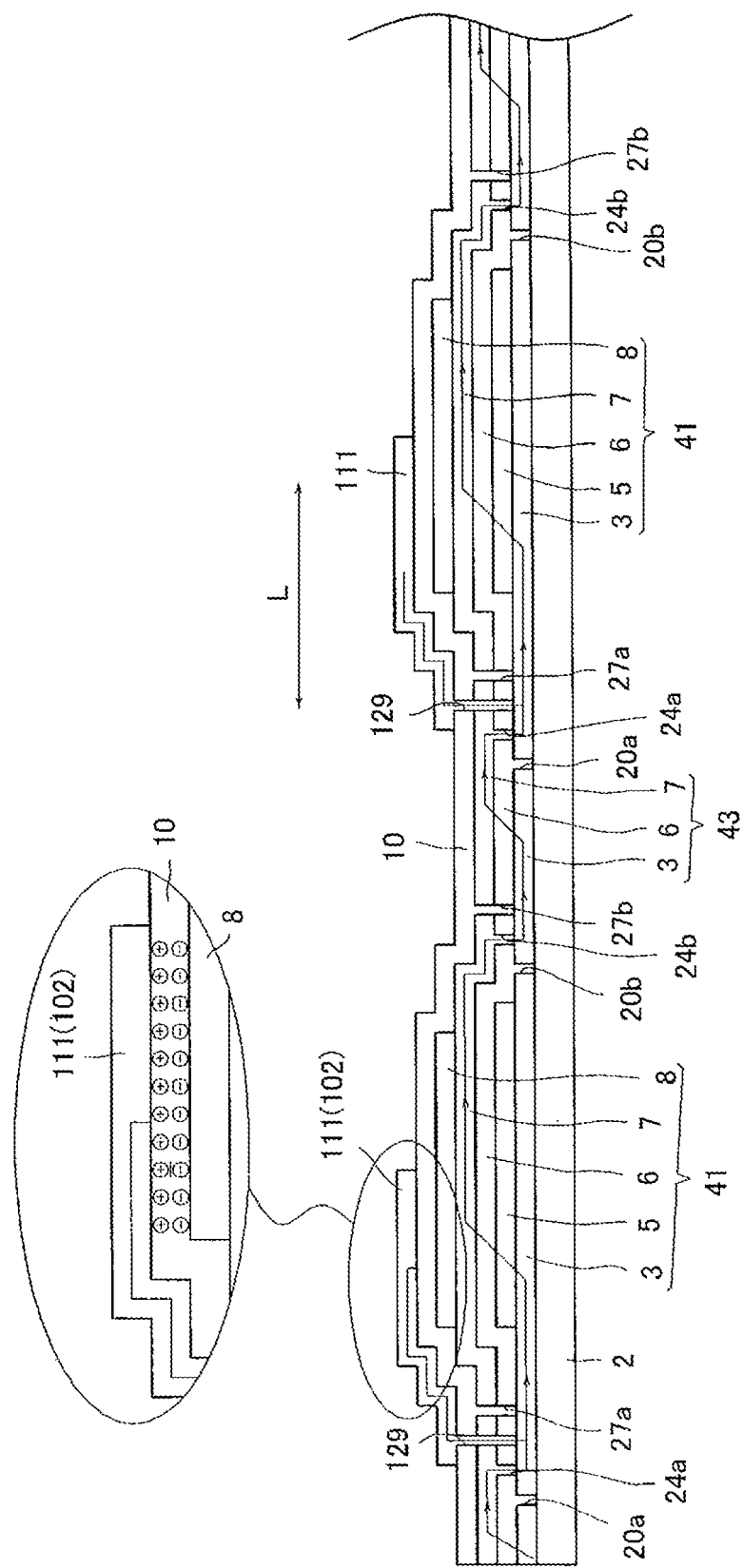
FIG. 32 is an explanatory diagram showing a flow of electric current in the organic EL device in FIG. 23, the flow of electric current in a backward direction being indicated by an arrow in FIG. 25.

When electric current flows in a backward direction, the electric current having reached the first electrode layer 3 in the column-type unit organic EL element 43 is transmitted through the above-mentioned conductive path as shown in FIGS. 31 and 32. And in addition to this conductive path, the electric current is transmitted partly through the insulation layer separation grooves 129 to the fourth electrode layer 11 (electrode parts 102), and then electric charge is accumulated on the surface of the insulation layer 10 (near the fourth electrode layer 111) having contact with the fourth electrode layer 111.

Figure 33:
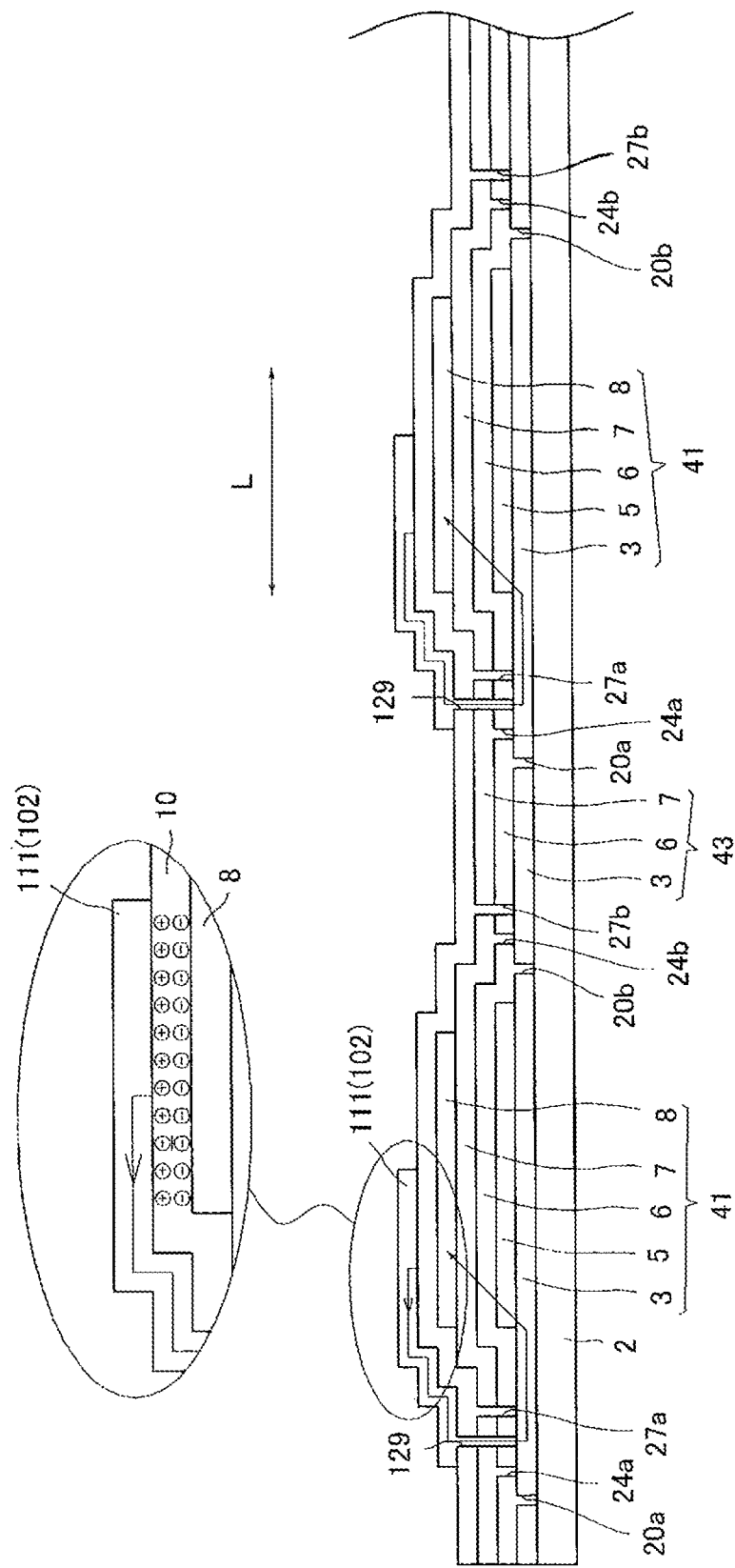
FIG. 33 is an explanatory diagram showing a flow of electric current in the organic EL device in FIG. 23, the flow of electric current upon switching of the electric current from the backward direction to the forward direction being indicated by an arrow in FIG. 25.

With this state, upon inversion of negative and positive poles due to a switching cycle of the AC power source, the electric current flows in a backward direction, as shown in FIG. 33, by the electric charge having been accumulated on the surface of the insulation layer 10 (near the fourth electrode layer 111), so as to be transmitted to the first electrode layer 3 in the crossing unit organic EL element 41 through the insulation layer separation grooves 129. The electric current further flows through the first electrode layer 3, the first functional layer 5, and the second functional layer 6 up to the second electrode layer 7 within the crossing unit organic EL elements 41. At this time, the first functional layer 5 and the second functional layer 6 emit light. In sum, after the switching, the first functional layer 5 and the second functional layer 6 within the crossing unit organic EL elements 41 emit light for a predetermined period of time.

In this way, when negative and positive poles are reversed by a switching cycle of the AC power source, the crossing unit organic EL elements 41 continuously and uninterruptedly emit light, thereby further preventing flickering.

The above-mentioned embodiments each illustrate the case where the organic EL device is connected to the AC power source, but a power source to be connected to the organic EL device of this invention is not limited to an AC power source. Specifically, the device can be connected to a DC power source.

Figure 34A:
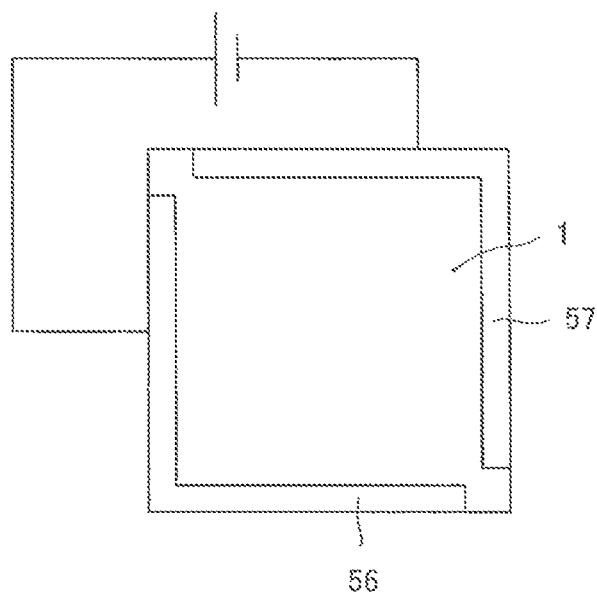
FIGS. 34A to 34B are conceptual diagrams showing the organic EL device in FIG. 1 connected to a DC power source.
Figure 34B:
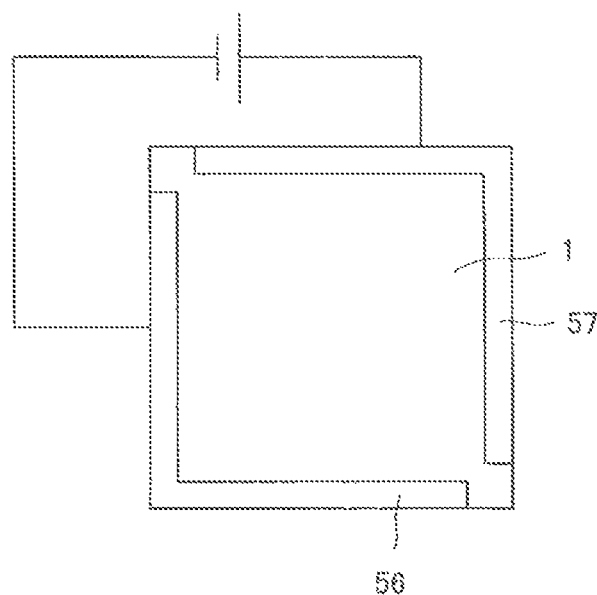

In this case, any connection of negative and positive poles of the DC power source in a forward direction (FIG. 34*a*) or in a backward direction (FIG. 34*b*) makes the organic EL device function as a lighting equipment, so that the device emits light in a desired direction in a thickness direction and is excellent in plasticity to the environment.

Figure 35:
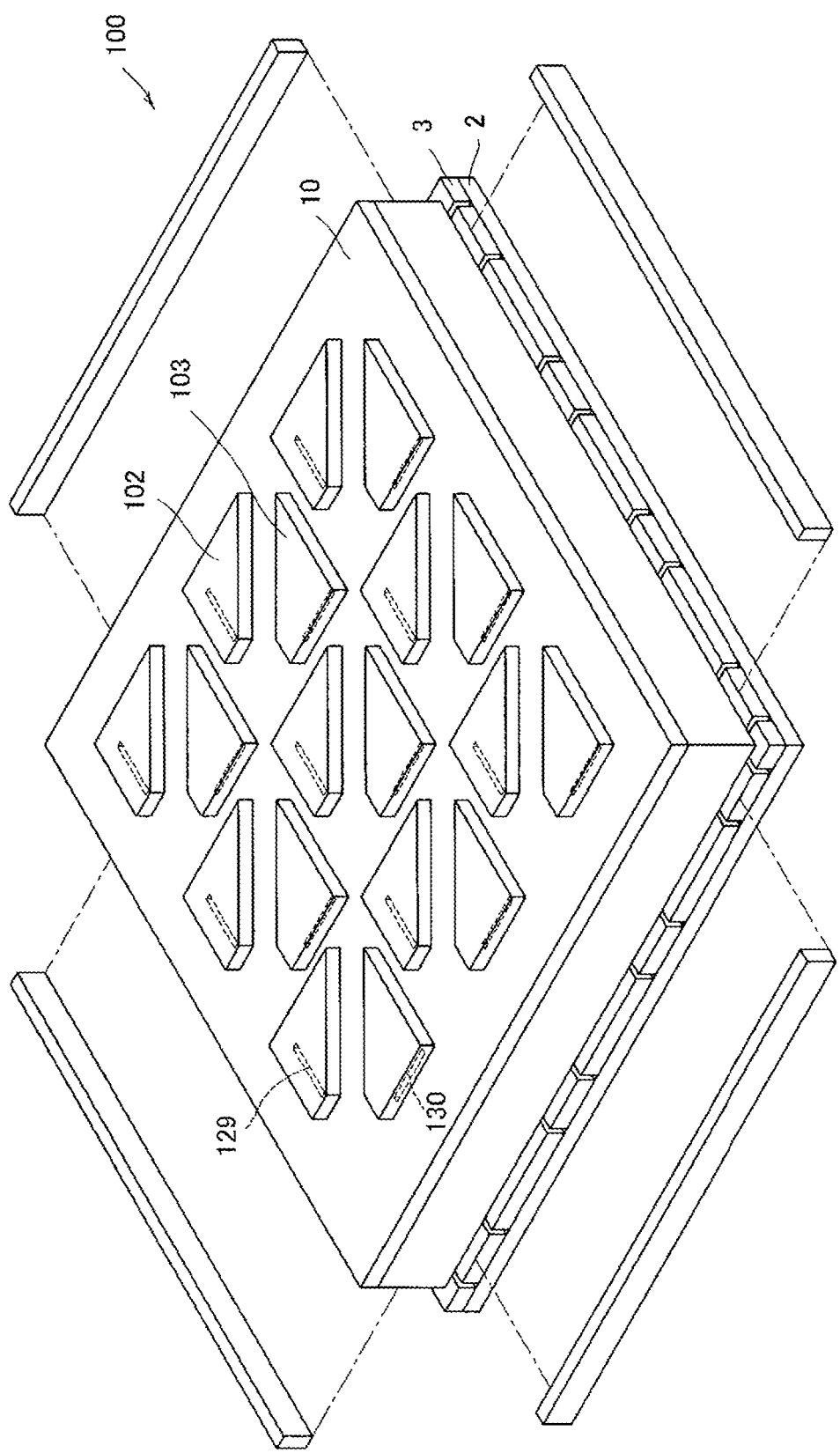
FIG. 35 is an explanatory diagram of an organic EL device in another embodiment of this invention in a state in which power supply electrodes are removed.

The above-mentioned embodiments each use the power supply electrodes 56 and 57 each having an L shape, but the present invention is not limited thereto. It is only necessary to make the extraction region 35 and the extraction region 38 be the same potential and to make the extraction region 36 and the extraction region 37 be the same potential. Specifically, a plurality of power supply electrodes each having a linear shape as shown in FIG. 35 may be attached to the vicinity of each side.

The above-mentioned embodiments employ the organic EL element column 16 and the organic EL element row 17 having the same width, but the present invention is not limited thereto and may employ those having different widths.

Especially, in a case of the use for a DC power source, a dimming function may be added by employing the organic EL element column 16 and the organic EL element row 17 having different widths and selecting either the organic EL element column 16 or the organic EL element row 17 in which electric current is flowing.

Further, as an example of the use of the above-mentioned embodiments, a dimming function may be added by changing an earth resistance against ground.

In the above-mentioned first and second embodiments, the insulation layer is directly stacked on the third electrode layer, and in the second embodiment, the fourth electrode layer is directly stacked on the insulation layer, but the present invention is not limited to such a configuration and may have a different layer between layers. An adhesive layer for improving an adhesiveness of interfaces between the third electrode layer and the insulation layer may be located between the third electrode layer and the insulation layer, for example. Alternatively, an adhesive layer for improving an adhesiveness of interfaces between the insulation layer and the fourth electrode layer may be located between the insulation layer and the fourth electrode layer.

Herein, the present specification discloses the invention below.

An organic EL device formed of at least a substrate-side electrode layer, a rear face-side electrode layer, and an organic light-emitting layer sandwiched between the two electrode layers on a substrate having a planar expanse, the device further comprising (1) a dielectric layer having dielectricity stacked on an upper side of the rear face-side electrode layer in the stacking direction and (2) a dielectric electrode layer stacked on an upper side of the dielectric layer in the stacking direction and on a projected plane in a member thickness direction of the crossing part of the organic EL element belts, and the dielectric electrode layer being electrically connected to the substrate-side electrode layer.

The invention claimed is:

1. An organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts having in its longitudinal direction a conductive path through which electric current passes, the organic EL element belts extending in different longitudinal directions and crossing with each other, forming a crossing part, so that the conductive paths cross with each other within the organic EL element belts and within the crossing part, the organic EL element belts crossing with each other in a grid pattern, the organic El device having a non-light emitting region surrounded by the organic EL element belts, the organic EL element belts each being formed of a stack of a substrate-side electrode layer, a functional layer, and a rear face-side electrode layer, and the substrate-side electrode layer having at least one groove dividing the layer, wherein the groove is formed over the non-light emitting region and a region where the organic EL element belt is located.

2. An organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts having in its longitudinal direction a conductive path through which electric current passes, and the organic EL element belts extending in different longitudinal directions and crossing with each other, forming a crossing part, so that the conductive paths cross with each other within the organic EL element belts and within the crossing part, wherein the organic EL element belts comprise at least one organic EL element column extending in one direction and at least one organic EL element row extending in a direction crossing with the organic EL element column, the unit organic EL elements making up the organic EL element column each being formed of a stack of the two electrode layers and a column-type functional layer between the two electrode layers, the unit organic EL elements making up the organic EL element row each being formed of a stack of the two electrode layers and a row-type functional layer between the two electrode layers, and the crossing part including both the column-type functional layer and the row-type functional layer stacked between the two electrode layers.

3. An organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts having in its longitudinal direction a conductive path through which electric current passes, and the organic EL element belts extending in different longitudinal directions and crossing with each other, forming a crossing part, so that the conductive paths cross with each other within the organic EL element belts and within the crossing part, wherein the organic EL element belts comprise at least one organic EL element column extending in one direction and at least one organic EL element row extending in a direction crossing with the organic EL element column, wherein the electrode layers include a first electrode layer, a second electrode layer, and a third electrode layer, the unit organic EL elements making up the organic EL element column each being formed of a stack of the first electrode layer, the second electrode layer, and a column-type functional layer between the first and the second electrode layers, the unit organic EL elements making up the organic EL element row each being formed of a stack of the first electrode layer, the third electrode layer, and a row-type functional layer between the first and the third electrode layers, and the crossing part including the first electrode layer, the second electrode layer, and the third electrode layer and further including the column-type functional layer and the row-type functional layer either between the first electrode layer and the second electrode layer or between the first electrode layer and the third electrode layer.

4. An organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts having in its longitudinal direction a conductive path through which electric current passes, the organic EL element belts extending in different longitudinal directions and crossing with each other, forming a crossing part, so that the conductive paths cross with each other within the organic EL element belts and within the crossing part, the unit organic EL elements each having a pn junction, and the organic EL element belts each being formed of a serial connection of the pn junctions of the unit organic EL elements belonging to the belt, wherein the organic EL element belts each have a p-side power supply part and an n-side power supply part, and the p-side power supply part and the n-side power supply part of the organic EL element belts being connected to an AC power source in parallel.

5. An organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts having in its longitudinal direction a conductive path through which electric current passes, and the organic EL element belts extending in different longitudinal directions and crossing with each other, forming a crossing part, so that the conductive paths cross with each other within the organic EL element belts and within the crossing part, wherein the organic EL element belts comprise: (1) a plurality of organic EL element columns each extending in one direction and having a first end at one side and a second end at the other side and (2) a plurality of organic EL element rows each extending in a direction crossing with the organic EL element column and having a third end at one side and a fourth end at the other side, the unit organic EL elements each having a pn junction with a p-side and an n-side, the first ends being in electrical contact with a p-side of the unit organic EL elements and the second ends being in electrical contact with the n-side, the third ends being in electrical contact with the p-side of the unit organic EL elements and the fourth ends being in electrical contact with the n-side, and the first ends of the organic EL element columns in electrical contact with the p-side and the fourth ends of the organic EL element rows in electrical contact with the n-side being in electrical contact with each other.

6. An organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts having in its longitudinal direction a conductive path through which electric current passes, and the organic EL element belts extending in different longitudinal directions and crossing with each other, forming a crossing part, so that the conductive paths cross with each other within the organic EL element belts and within the crossing part, wherein the substrate has a periphery, wherein the device has a plurality of extraction regions formed along the periphery of the substrate, the extraction regions each including one electrode layer and being in electrical contact with the organic EL element belts, and the device further comprising a power supply electrode attached over a plurality of the extraction regions.

7. An organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts having in its longitudinal direction a conductive path through which electric current passes, the organic EL element belts extending in different longitudinal directions and crossing with each other, forming a crossing part, so that the conductive paths cross with each other within the organic EL element belts and within the crossing part, the unit organic EL elements each being formed of a stack of a substrate-side electrode layer, the organic light-emitting layer, and a rear face-side electrode layer in order in a stacking direction from a side of the substrate, the device further comprising (1) a dielectric layer having dielectricity stacked on an upper side of the rear face-side electrode layer in the stacking direction and (2) a dielectric electrode layer stacked on an upper side of the dielectric layer in the stacking direction and on a projected plane in a member thickness direction of the crossing part of the organic EL element belts, and the dielectric electrode layer being electrically connected to the substrate-side electrode layer.

8. The organic EL device as defined in claim 7, wherein the organic EL element belts comprise at least one organic EL element column extending in one direction and at least one organic EL element row extending in a direction crossing with the organic EL element column, the dielectric electrode layer comprising one electrically connected to the substrate-side electrode layer of the organic EL element column and one electrically connected to the substrate-side electrode layer of the organic EL element row.

9. A method for manufacturing an organic EL device comprising a substrate having a planar expanse and unit organic EL elements planarly distributed on the substrate, the unit organic EL elements each mainly consisting of at least two electrode layers and an organic light-emitting layer sandwiched between the electrode layers, the device having a plurality of organic EL element belts each formed of a plurality of the unit organic EL elements electrically connected in series so as to extend in a strip-like shape, each of the organic EL element belts each having in its longitudinal direction a conductive path through which electric current passes, and the organic EL element belts extending in different longitudinal directions and crossing with each other, forming a crossing part, so that the conductive paths cross with each other within the organic EL element belts and within the crossing part, the method comprising the steps of:

a first electrode layer forming process of forming a first electrode layer on the substrate, a first electrode layer separation process of forming a first electrode layer separation groove by laser-scribing the first electrode layer, a preceding functional layer forming process of forming a first functional layer including a hole injection layer, a hole transport layer, a light-emitting layer, an electron transport layer, and an electron injection layer sequentially at a certain position, a succeeding functional layer forming process of forming a second functional layer including a hole injection layer, a hole transport layer, a light-emitting layer, an electron transport layer, and an electron injection layer sequentially over a part overlapping the first functional layer and a part without overlapping the first functional layer, an electrode connection groove forming process of forming an electrode connection groove by laser scribing, a second electrode layer forming process of forming an electrode layer so as to overlap one of the first functional layer and the second functional layer, a third electrode layer forming process of forming an electrode layer so as to overlap the other of the first functional layer and the second functional layer, and a unit organic EL element separation groove forming process of forming a unit organic EL element separation groove by laser scribing.

10. The method as defined in claim 9 further comprising the steps of:

an insulation layer forming process of forming an insulation layer, an insulation groove forming process of forming an opening reaching the first electrode layer by laser-scribing the insulation layer, and a dielectric electrode layer forming process of forming a dielectric electrode layer.

\* \* \* \* \*